United States Patent
Azmat et al.

(10) Patent No.: US 10,170,421 B2
(45) Date of Patent: Jan. 1, 2019

(54) LOGIC SEMICONDUCTOR DEVICES

(71) Applicant: Samsung Electronics Co., Ltd., Suwon-si, Gyeonggi-do (KR)

(72) Inventors: Raheel Azmat, Suwon-si (KR);
Sengupta Rwik, Austin, TX (US);
Su-Hyeon Kim, Bucheon-si (KR);
Chul-Hong Park, Seongnam-si (KR);
Jae-Hyoung Lim, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/647,467

(22) Filed: Jul. 12, 2017

(65) Prior Publication Data

US 2017/0309569 A1 Oct. 26, 2017

Related U.S. Application Data

(63) Continuation of application No. 15/188,743, filed on Jun. 21, 2016, now Pat. No. 9,741,661.

(30) Foreign Application Priority Data

Oct. 23, 2015 (KR) .................. 10-2015-0147869

(51) Int. Cl.
*H01L 21/00* (2006.01)
*H01L 23/00* (2006.01)
(Continued)

(52) U.S. Cl.
CPC .... *H01L 23/5286* (2013.01); *H01L 21/28518* (2013.01); *H01L 21/823814* (2013.01);
(Continued)

(58) Field of Classification Search
CPC ....... H01L 21/28518; H01L 21/823878; H01L 21/823871; H01L 21/823821;
(Continued)

(56) References Cited

U.S. PATENT DOCUMENTS 5,477,071 A 12/1995 Hamamoto et al.
7,045,411 B1 5/2006 Lee
(Continued)

FOREIGN PATENT DOCUMENTS

JP 2014-170788 A 9/2014
KR 10-2008-0100110 11/2008

*Primary Examiner* — Nikolay Yushin
(74) *Attorney, Agent, or Firm* — Myers Bigel, P.A.

(57) ABSTRACT

A logic semiconductor device includes a plurality of active patterns extending in a horizontal direction and being spaced apart from each other in a vertical direction, an isolation layer defining the active patterns, a plurality of gate patterns extending in the vertical direction on the active patterns and the isolation layer, the gate patterns being spaced apart from each other in the horizontal direction, a plurality of lower wirings extending in the horizontal direction over the gate patterns, a plurality of upper wirings extending in the vertical direction over the lower wirings, a through contact connecting at least one upper wiring of the upper wirings and at least one gate pattern of the gate patterns, the through contact extending from a bottom surface of the upper wiring to a position under a bottom surface of one of the lower wirings relative to the active patterns.

18 Claims, 37 Drawing Sheets

(51) Int. Cl.

| | | |
|---|---|---|
| *H01L 27/00* | (2006.01) | |
| *H01L 29/00* | (2006.01) | |
| *H01L 23/528* | (2006.01) | |
| *H01L 21/285* | (2006.01) | |
| *H01L 21/8238* | (2006.01) | |
| *H01L 27/092* | (2006.01) | |
| *H01L 29/06* | (2006.01) | |
| *H01L 29/08* | (2006.01) | |
| *H01L 29/16* | (2006.01) | |
| *H01L 29/161* | (2006.01) | |
| *H01L 29/165* | (2006.01) | |
| *H01L 29/66* | (2006.01) | |
| *H01L 29/78* | (2006.01) | |

(52) U.S. Cl.
CPC ........ *H01L 21/823821* (2013.01); *H01L 21/823871* (2013.01); *H01L 21/823878* (2013.01); *H01L 27/0924* (2013.01); *H01L 29/0653* (2013.01); *H01L 29/0847* (2013.01); *H01L 29/161* (2013.01); *H01L 29/165* (2013.01); *H01L 29/1608* (2013.01); *H01L 29/66545* (2013.01); *H01L 29/7848* (2013.01)

(58) Field of Classification Search
CPC ....... H01L 21/823814; H01L 29/66545; H01L 29/165; H01L 29/161; H01L 29/1608; H01L 29/0847; H01L 29/0653; H01L 29/7848; H01L 27/0924; H01L 27/11582; H01L 27/0886; H01L 27/088; H01L 23/5286; H01L 23/485; H01L 23/5226; H01L 23/5283

See application file for complete search history.

(56) References Cited

U.S. PATENT DOCUMENTS

| | | | |
|---|---|---|---|
| 7,936,003 B2 * | 5/2011 | Kang | .................... H01L 27/105 |
| | | | 257/314 |
| 8,013,373 B2 | 9/2011 | Uchiyama | |
| 2006/0170031 A1 * | 8/2006 | Kang | .................... H01L 27/105 |
| | | | 257/315 |
| 2007/0096154 A1 | 5/2007 | Shimbo et al. | |
| 2010/0327459 A1 | 12/2010 | Yasumori et al. | |
| 2011/0193234 A1 | 8/2011 | Chen et al. | |
| 2012/0286858 A1 | 11/2012 | Biggs et al. | |
| 2014/0239410 A1 | 8/2014 | Yang et al. | |
| 2014/0298284 A1 | 10/2014 | Hsu et al. | |
| 2014/0327081 A1 | 11/2014 | Hsieh et al. | |
| 2015/0021782 A1 | 1/2015 | Kodama et al. | |
| 2015/0171005 A1 | 6/2015 | Chen et al. | |
| 2015/0357337 A1 | 12/2015 | Takaishi | |
| 2016/0148907 A1 | 5/2016 | Segawa et al. | |

\* cited by examiner

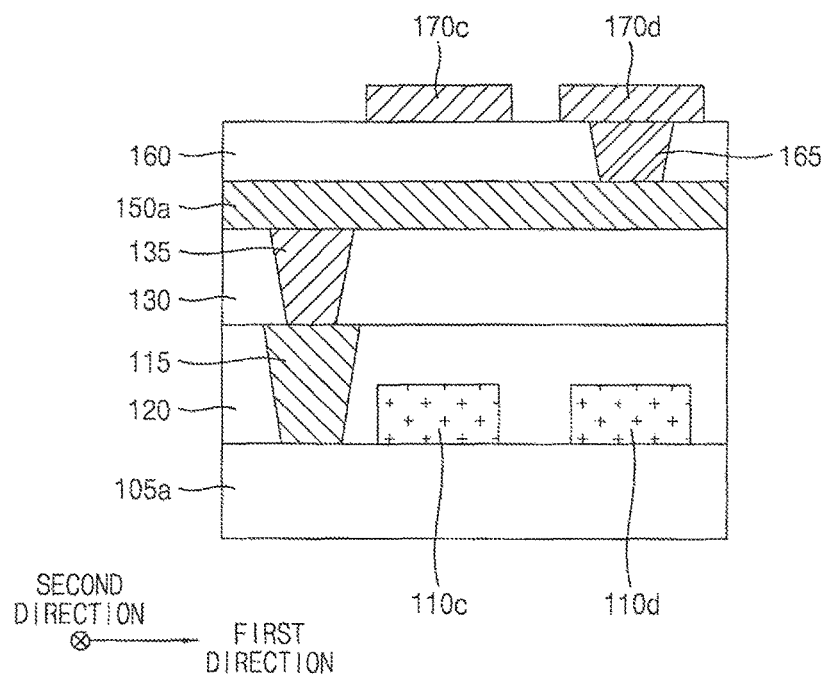
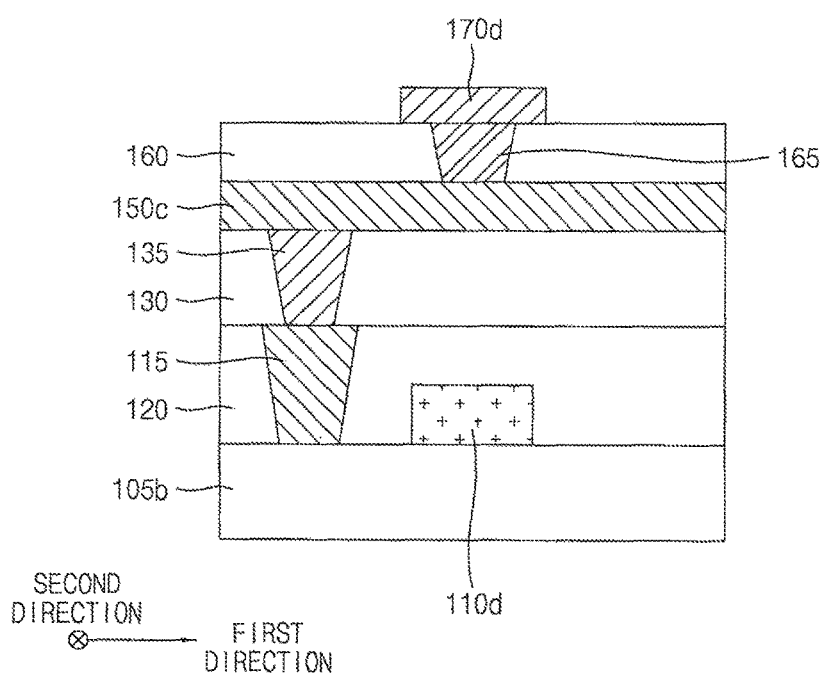

FIG. 21
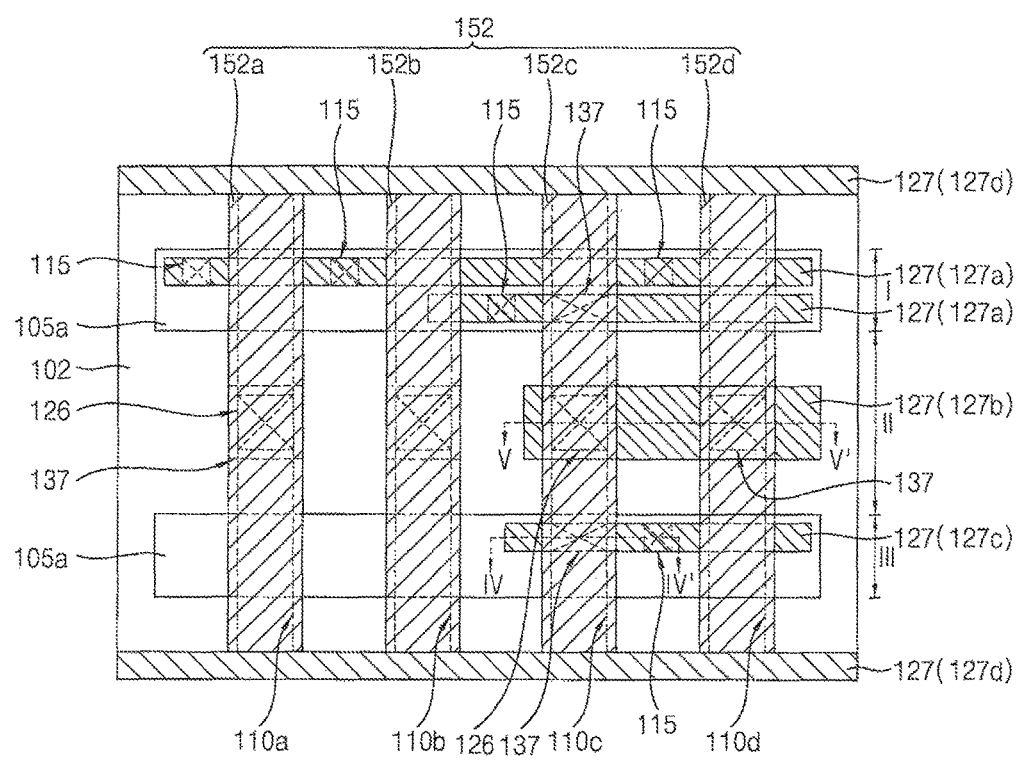
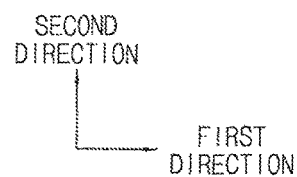

FIG. 41
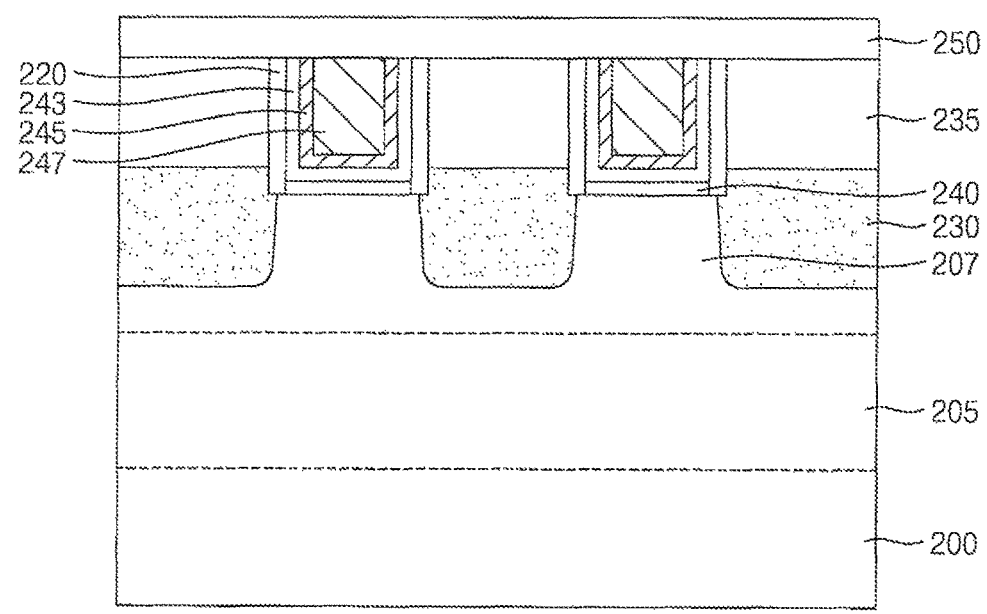
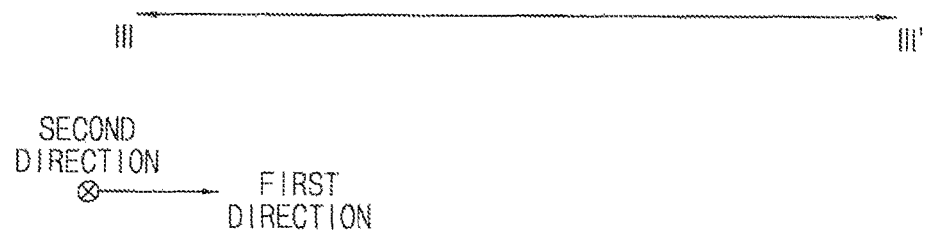

FIG. 43
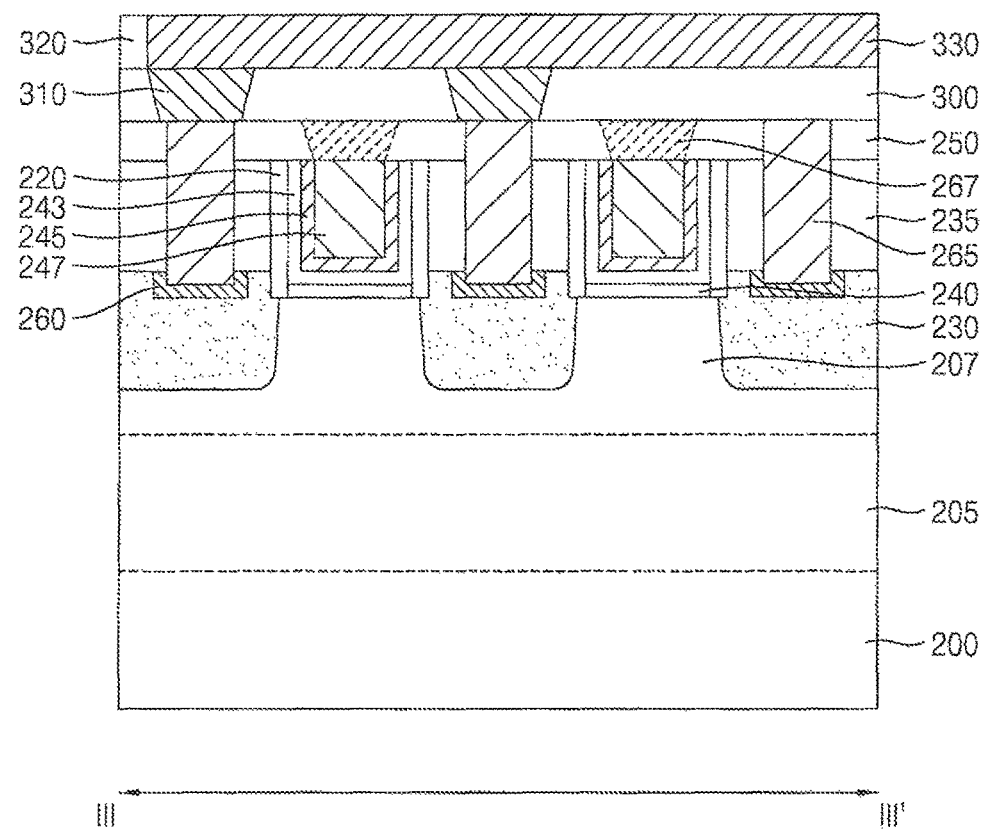
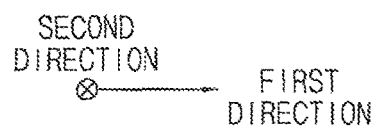

SECOND
DIRECTION
⊗———— FIRST
       DIRECTION

FIG. 46
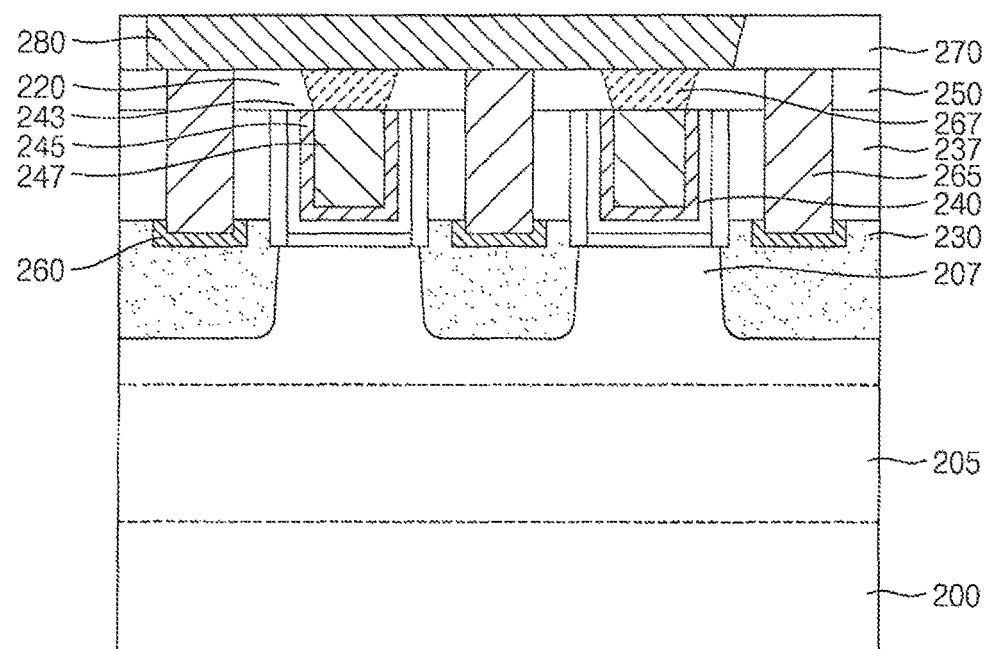
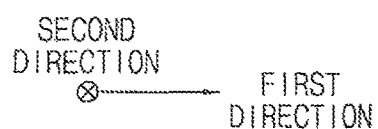

LOGIC SEMICONDUCTOR DEVICES

CROSS-REFERENCE TO RELATED APPLICATION

The present application is a continuation application of and claims priority from U.S. patent application Ser. No. 15/188,743, filed on Jun. 21, 2016, and claims priority under 35 USC § 119 to Korean Patent Application No. 10-2015-0147869, filed on Oct. 23, 2015, in the Korean Intellectual Property Office (KIPO), the contents of which are incorporated by reference herein in their entirety.

BACKGROUND

1. Field

Example embodiments relate to logic semiconductor devices. More particularly, example embodiments relate to logic semiconductor devices including multi-leveled wirings.

2. Description of the Related Art

In a logic semiconductor device including a standard cell, a logic transistor including a gate pattern may be formed on a semiconductor substrate, and wirings may be arranged over the logic transistor. As a critical dimension of the gate pattern decreases to a nano-scale, a width and a pitch of the wiring may be also reduced.

As a degree of integration of the logic semiconductor device increases, a process margin for designing the wirings may be reduced, and the wirings having a dimension less than a target value may not be easily formed due to a resolution limit of a patterning process.

SUMMARY

Example embodiments provide a logic semiconductor device having improved operational reliability and a degree of integration.

According to example embodiments, there is provided a logic semiconductor device that may include a plurality of active patterns extending in a horizontal direction and being spaced apart from each other in a vertical direction, an isolation layer defining the active patterns, a plurality of gate patterns extending in the vertical direction on the active patterns and the isolation layer, the gate patterns being spaced apart from each other in the horizontal direction, a plurality of lower wirings extending in the horizontal direction over the gate patterns, a plurality of upper wirings extending in the vertical direction over the lower wirings, and a through contact connecting at least one upper wiring of the upper wirings and at least one gate pattern of the gate patterns, the through contact extending from a bottom surface of the upper wiring to a position under a bottom surface of one of the lower wirings relative to the active patterns.

In example embodiments, the logic semiconductor device may further include a gate contact on the gate pattern.

In example embodiments, the through contact may directly contact the bottom surface of the upper wiring and the top surface of the gate contact.

In example embodiments, the logic semiconductor device may further include an active contact electrically connected to an upper portion of the active patterns adjacent to the gate patterns.

In example embodiments, top surfaces of the active contact and the gate contact relative to the active patterns may be coplanar with each other.

In example embodiments, the active contact may be electrically connected to one of the lower wirings.

In example embodiments, the logic semiconductor device may further include a first contact connecting the active contact and one of the lower wirings, and a second contact connecting at least one of the lower wirings and at least one of the upper wirings.

In example embodiments, each of the upper wirings may overlap each of the gate patterns.

In example embodiments, the lower wirings may overlap the active patterns.

In example embodiments, the lower wirings may not overlap a portion of the isolation layer between the active patterns.

According to example embodiments, there is provided a logic semiconductor device that may include a plurality of active patterns extending in a horizontal direction and being spaced apart from each other in a vertical direction, an isolation layer defining the active patterns, a plurality of gate patterns extending in the vertical direction on the active patterns and the isolation layer, the gate patterns being spaced apart from each other in the horizontal direction, a plurality of lower wirings extending in the horizontal direction over the gate patterns, an insulation block dividing at least one lower wiring of the lower wirings into a plurality of fragments, and a plurality of upper wirings extending in the vertical direction over the lower wirings.

In example embodiments, the logic semiconductor device may include a first region, a second region and a third region. The active patterns may be disposed in the first region and the third region, and a portion of the isolation layer between the active patterns may be exposed in the second region. The lower wirings may include a first lower wiring, a second lower wiring and a third lower wiring disposed in the first region, the second region and the third region, respectively.

In example embodiments, the first lower wiring is one of a plurality of first lower wirings and the third lower wiring is one of a plurality of third lower wirings and the plurality of the first lower wirings or the plurality of the third wirings may be disposed in the first region or the third region, respectively. The second lower wiring may include a single second lower wiring in the second region.

In example embodiments, the second lower wiring may have a width greater than a width of each of the first lower wiring and the third lower wiring.

In example embodiments, the at least one lower wiring may include the second lower wiring.

In example embodiments, the insulation block may include a first insulation block dividing the second lower wiring, and a second insulation block confining the lower wirings and being commonly provided at peripheral portions of the first region, the second region and the third region.

In example embodiments, the second lower wiring is one of a plurality of second lower wirings and the first insulation block is one of a plurality of first insulation blocks, which are disposed in the second region. The first insulation blocks may be arranged in a staggered configuration in a plane view.

In example embodiments, the lower wirings may further include a fourth lower wiring disposed at a peripheral portion in the vertical direction of the logic semiconductor device. The fourth lower wiring may serve as a power rail.

In example embodiments, the logic semiconductor device may further include active contacts electrically connected to upper portions of the active patterns adjacent to the gate patterns, gate contacts disposed on the gate patterns, first contacts connecting the gate contacts or the active contacts to the lower wirings, and second contacts connecting the lower wirings and the upper wirings.

In example embodiments, a gate pick-up unit may be defined by one of the gate contacts, a first contact of the first contacts and a second contact of the second contacts overlapping each other along a height direction of the logic semiconductor device.

In example embodiments, the gate pick-up unit is one of a plurality of gate pick-up units, which may be linearly arranged along the horizontal direction in the second region.

In example embodiments, the gate pick-up unit is one of a plurality of gate pick-up units, which may be arranged in a staggered configuration in a plan view in the second region.

In example embodiments, the upper wirings may serve as input/output pins of the logic semiconductor device.

In example embodiments, the second contacts may be distributed 2-dimensionally in a plan view throughout the first region, the second region and the third region.

In example embodiments, a pin swap may be implemented by the second contacts.

According to example embodiments, there is provided a logic semiconductor device that may include a plurality of active patterns extending in a horizontal direction and being spaced apart from each other in a vertical direction, an isolation layer defining the active patterns, a plurality of gate patterns extending in the vertical direction on the active patterns and the isolation layer, the gate patterns being spaced apart from each other in the horizontal direction, active contacts connected to upper portions of the active patterns adjacent to the gate patterns, a plurality of sub-wirings integrally connected to the active contacts, the sub-wirings extending in the horizontal direction, and wirings extending in the vertical direction over the sub-wirings.

In example embodiments, the logic semiconductor device may further include gate contacts disposed on the gate patterns.

In example embodiments, top surfaces of the sub-wirings and the gate contacts may be coplanar with each other relative to the active patterns.

In example embodiments, the wirings may be disposed at a single level, and each of the wirings may overlap each of the gate patterns.

In example embodiments, the logic semiconductor device may further include first contacts connecting the gate contacts and the wirings.

In example embodiments, the logic semiconductor device may further include silicide patterns formed at the upper portions of the active patterns adjacent to the gate patterns. The active contacts may be in contact with the silicide patterns.

According to example embodiments, there is provided a logic semiconductor device that may include a plurality of active patterns extending in a horizontal direction and being spaced apart from each other in a vertical direction, an isolation layer defining the active patterns, a plurality of gate patterns extending in the vertical direction on the active patterns and the isolation layer, the gate patterns being spaced apart from each other in the horizontal direction, a plurality of lower wirings extending in the horizontal direction over the gate patterns and being spaced apart from each other in the vertical direction, the lower wirings having a straight line shape, and a plurality of upper wirings extending in the vertical direction over the lower wirings and being spaced apart from each other in the horizontal direction, the upper wirings having a straight line shape.

In example embodiments, the lower wirings and the upper wirings may not include a protrusion or a diverging portion.

In example embodiments, the logic semiconductor device may further include first contacts connecting the gate patterns or active patterns to the lower wirings, and second contacts connecting the upper wirings and the lower wirings.

In example embodiments, the upper wirings may serve as input/output pins, and the lower wirings may serve as a gate pick-up wiring and a power rail.

According to example embodiments a logic semiconductor device includes an active pattern, a gate pattern on the active pattern, an upper wiring aligned with the gate pattern and extending in a first direction, and a lower wiring between the gate pattern and the upper wiring and being aligned with the active pattern so as to extend in a second direction, the upper wiring crossing over the lower wiring.

In example embodiments, the logic semiconductor device may further include an interlayer insulating layer between the upper wiring and the lower wiring and a contact extending through the interlayer insulating layer so as to connect the lower wiring to the upper wiring.

In example embodiments, edges of the upper wiring are substantially straight without deviating from the first direction and edges of the lower wiring are substantially straight without deviating from the second direction.

In example embodiments, the lower wiring is one of a plurality of lower wirings and the plurality of lower wirings includes a power rail, the power rail having a width in the first direction that is greater than widths of other ones of the plurality of lower wirings.

In example embodiments, the logic semiconductor device may further include an insulation block that is configured to divide the lower wiring into a first lower wiring portion and a second lower wiring portion.

In example embodiments, the active pattern is a first active pattern and the gate pattern is a first gate pattern, the logic semiconductor device thriller includes: a second active pattern, a second gate pattern on the second active pattern, a first gate contact on the first gate pattern, a second gate contact on the second gate pattern, a first contact that connects the first lower wiring portion to the first gate contact, and a second contact that connects the second lower wiring portion to the second gate contact.

In example embodiments, the logic semiconductor device further includes a gate contact on the gate pattern, a plurality of interlayer insulating layers between the upper wiring and the gate contact, and a through contact extending through the plurality of interlayer insulating layers so as to connect the upper wiring to the gate contact.

In example embodiments, the lower wiring is one of a plurality of lower wirings, further and the logic semiconductor device further includes: a plurality of insulation blocks, each of the plurality of lower wirings being divided by at least one of the plurality of insulation blocks into multiple portions.

In example embodiments, the plurality of insulation blocks is arranged in a staggered configuration along the second direction when the logic semiconductor device is viewed from a plan view.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are explained in detail in the specification set forth below.

BRIEF DESCRIPTION OF THE DRAWINGS

Example embodiments will be more clearly understood from the following detailed description taken in conjunction with the accompanying drawings. FIGS. 1 to 47 represent non-limiting, example embodiments as described herein.

FIG. 1 is a top plan view illustrating a logic semiconductor device in accordance with example embodiments of the inventive concept;

FIGS. 2 and 3 are cross-sectional views taken along lines I-I' and II-II', respectively, indicated in FIG. 1;

FIG. 4 is a top plan view illustrating a logic semiconductor device in accordance with example embodiments of the inventive concept;

FIGS. 5, 6, 7 and 8 are cross-sectional views taken along lines I-I', II-II', III-III' and IV-IV', respectively, indicated in FIG. 4;

FIG. 9 is a top plan view illustrating a logic semiconductor device in accordance with example embodiments of the inventive concept;

FIGS. 10, 11 and 12 are cross-sectional views taken along lines II-II', IV-IV' and V-V', respectively, indicated in FIG. 9;

FIG. 13 is a top plan view illustrating a logic semiconductor device in accordance with example embodiments of the inventive concept;

FIGS. 14 and 15 are cross-sectional views taken along lines II-II' and IV-IV', respectively, indicated in FIG. 13;

FIG. 16 is a top plan view illustrating a logic semiconductor device in accordance with example embodiments of the inventive concept;

FIGS. 17, 18, 19 and 20 are cross-sectional views taken along lines I-I', II-II', III-III' and IV-IV', respectively, indicated in FIG. 16;

FIG. 21 is a top plan view illustrating a logic semiconductor device in accordance with example embodiments of the inventive concept;

FIGS. 22 and 23 are cross-sectional views taken along lines IV-IV' and V-V', respectively, indicated in FIG. 21;

FIG. 24 is a top plan view illustrating a logic semiconductor device in accordance with example embodiments of the inventive concept;

FIG. 25 is a cross-sectional view taken along a line I-I' indicated in FIG. 24;

FIGS. 26 to 44 are top plan views and cross-sectional views illustrating a method of manufacturing a semiconductor device in accordance with example embodiments of the inventive concept; and FIGS. 45, 46 and 47 are cross-sectional views illustrating a method of manufacturing a semiconductor device in accordance with example embodiments of the inventive concept.

DESCRIPTION OF EMBODIMENTS

Figure 1:
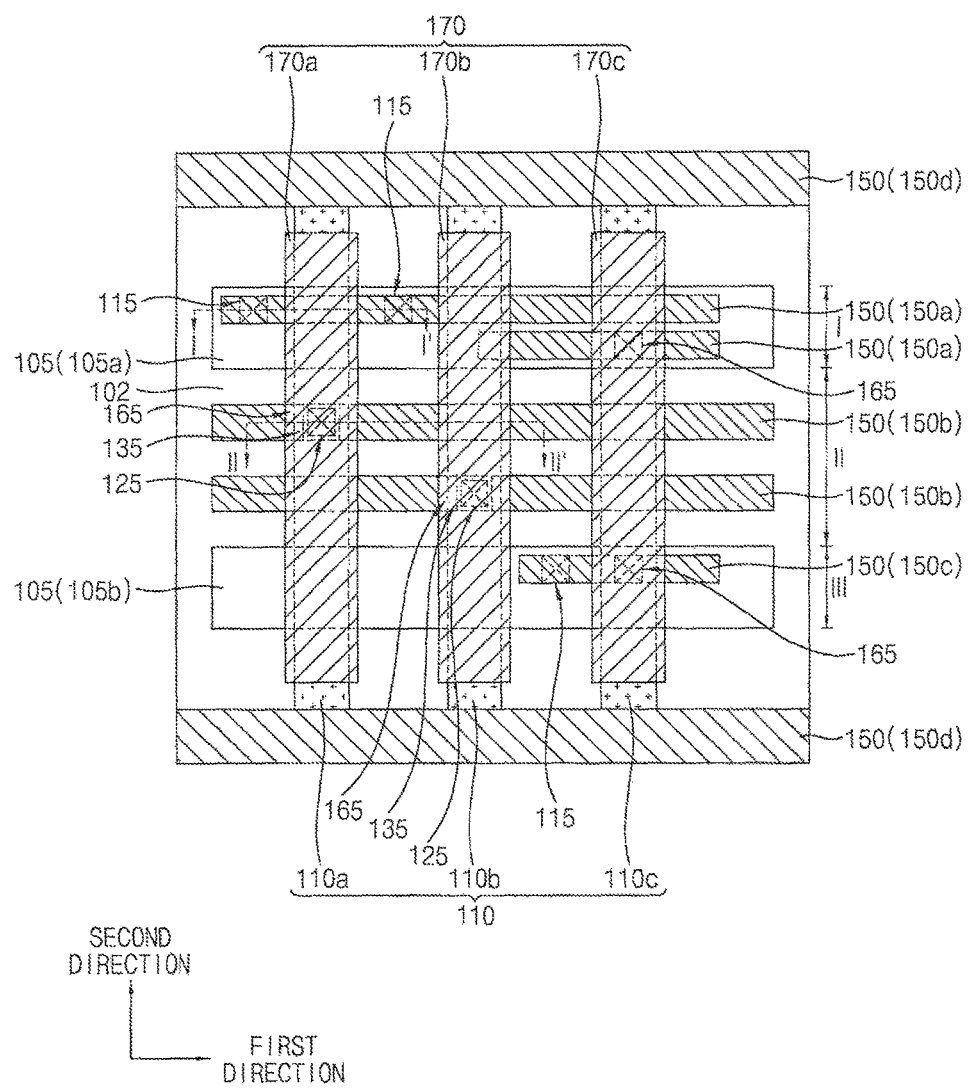

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout the description. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits. Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
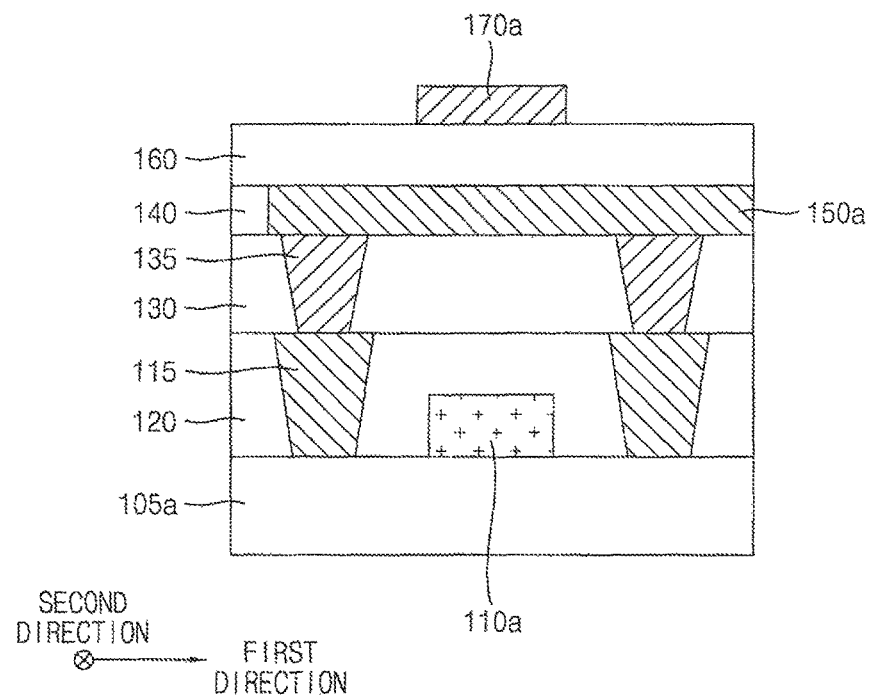
Figure 3:
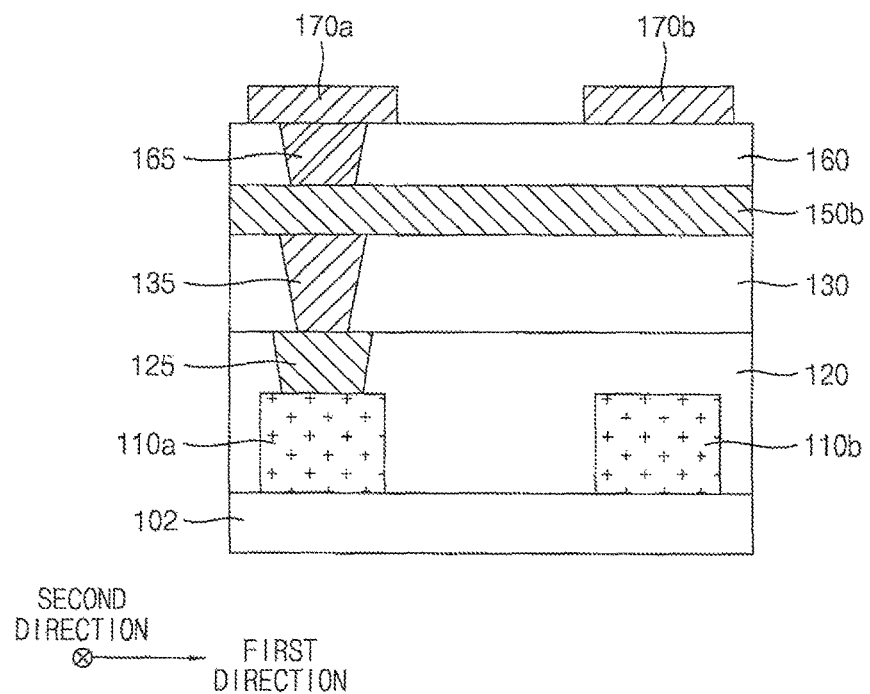

FIG. 1 is a top plan view illustrating a logic semiconductor device in accordance with example embodiments of the inventive concept. FIGS. 2 and 3 are cross-sectional views taken along lines I-I' and II-II', respectively, indicated in FIG. 1.

Two directions that may be parallel to each other in a plane view, and may be perpendicular to each other are defined as a first direction and a second direction. The definitions of the first and second directions are the same in FIGS. 4 to 25.

For example, the first direction may refer to a direction in which an active pattern 105 extends, or a horizontal direction. The second direction may refer to a direction in which a gate pattern 110 extends, or a vertical direction.

In some example embodiments, FIG. 1 may represent a layout for a circuit design of a logic standard cell. In this case, the logic semiconductor device illustrated in FIGS. 1 to 3 may be provided as a standard cell library.

In some embodiments, the logic semiconductor device may include a fin field-effect transistor (FinFET).

Referring to FIGS. 1 to 3, the logic semiconductor device may include the active patterns 105, the gate patterns 110, lower wirings 150, upper wirings 170 and contacts. The contacts may include an active contact 115, a gate contact 125, a first contact 135 and a second contact 165.

The active pattern 105 may have a line pattern shape defined by an isolation layer 102. For example, the active pattern 105 may be formed by performing a shallow trench isolation (STI) process on a semiconductor substrate. In some embodiments, the active pattern 105 may protrude from a top surface of the isolation layer 102, and may serve as a semiconductor fin.

As described above, the active pattern 105 may extend in the first direction.

In example embodiments, the logic semiconductor device or the semiconductor substrate may include a first region I, a second region II and a third region III. For example, the first region I and the third region III may correspond to a P-channel metal oxide semiconductor (PMOS) region and an N-channel metal oxide semiconductor (NMOS) region, respectively. The second region II may be allotted between the first region I and the third region III, and may correspond to an STI region.

The active pattern 105 may include a first active pattern 105a and a second active pattern 105b formed in the first region I and the third region III, respectively.

The gate pattern 110 may be disposed on the active pattern 105 and the isolation layer 102. As described above, the gate pattern 110 may extend in the second direction. A plurality of the gate patterns 110 may be arranged along the first direction. For example, a first gate pattern 110a, a second gate pattern 110b and a third gate pattern 110c may be arranged along the first direction.

As illustrated in FIG. 1, one of the gate patterns 110 may extend continuously on the first to third regions I, II and III, and may cross a plurality of the active patterns 105 (e.g., the first and second active patterns 105a and 105b).

In some embodiments, the gate pattern 110 may have a multi-stacked structure including a gate insulation pattern, a gate electrode and a gate mask. A gate spacer may be further formed on a sidewall of the gate pattern 110.

As illustrated in FIGS. 2 and 3, a lower insulation layer 120 covering the gate patterns 110 may be formed on the active pattern 110 and the isolation layer 102.

The active contact 115 may extend through the lower insulation layer 120, and may be in contact with the active pattern 105. In example embodiments, an impurity region (not illustrated) may be formed at an upper portion of the active pattern 105 adjacent to the gate pattern 110. The impurity region may serve as, e.g., a source/drain region. The active contact 115 may be in contact with or electrically connected to the impurity region.

In some embodiments, the FinFET may be defined by the impurity region and the gate pattern 110.

As illustrated in FIG. 3, the gate contact 125 may be in contact with or electrically connected to the gate pattern 110 in the lower insulation layer 120. In some embodiments, the gate contact 125 may be provided individually per at least one gate pattern 110. For example, as illustrated in FIG. 1, one gate contact 125 may be provided for each of the first gate pattern 110a and the second gate pattern 110b.

In some embodiments, a passivation layer covering the gate patterns 110 may be formed on the lower insulation layer 120, and the gate contact 125 may extend through the passivation layer to be disposed on the gate pattern 110.

A first insulating interlayer 130 covering the active contacts 115 and the gate contacts 125 may be formed on the lower insulation layer 120.

The first contacts 135 may extend through the first insulating interlayer 130, and may be in contact with or electrically connected to the active contact 115 and the gate contact 125.

A second insulating interlayer 140 may be formed on the first insulating interlayer 130. The lower wirings 150 may be disposed on the first insulating, interlayer 130, and may be formed in the second insulating interlayer 140.

The lower wiring 150 may extend in the first direction (e.g., the direction of the active pattern 105), and a plurality of the lower wirings 150 may be arranged along the second direction.

For example, the lower wirings 150 may include first to fourth lower wirings 150a to 150d. The first lower wiring 150a, the second lower wiring 150b and the third lower wiring 150c may be disposed in the first region I, the second region II and the third region III, respectively.

In example embodiments, the first lower wiring, 150a and the third lower wiring 150c may be electrically connected to the active patterns 105 via the first contacts 135 and the active contacts 115. The second lower wiring 150b may be electrically connected to the gate contact 125 via the first contact 135. Accordingly, a pick-up operation of the gate pattern 110 may be implemented through the second lower wiring 150b.

A plurality of the second lower wirings 150b may be arranged in the second region II. For example, two second lower wirings 150b may be arranged in the second region II for a gate pick-up of the first gate pattern 110a or the second gate, pattern 110b.

The fourth lower wring 150d may be disposed at a peripheral portion of the logic semiconductor device. For example, two fourth lower wirings 150d may be disposed at both peripheral portions in the second direction of the logic semiconductor device.

In example embodiments, the fourth lower wirings 150d may serve as a power rail (e.g., a VDD line or a VSS line). In some embodiments, the fourth lower wiring 150d may have a width (e.g., a width in the second direction) greater than that of each of the first to third lower wirings 150a, 150b and 150c. Thus, a resistance of the power rail may be reduced to improve an operation of the logic semiconductor device.

As described above, a horizontal routing (e.g., in the direction of the active pattern 105 or in the first direction) may be achieved by the lower wirings 150.

A third insulating interlayer 160 may be formed on the second insulating interlayer 140 and may cover the lower wirings 150.

The upper wirings 170 may be disposed on the third insulating interlayer 160. The upper wiring 170 may extend over the lower wiring 150 to cross a plurality of the lower wirings 150.

In example embodiments, the upper wiring 170 may be superimposed over the gate pattern 110, and may extend in the same direction as that of the gate pattern 110. For example, the upper wiring 170 may extend in the second direction, and a plurality of the upper wirings 170 may be arranged along the first direction. A vertical routing (e.g., in the direction of the gate pattern 110 or in the second direction) may be achieved by the upper wirings 170.

The upper wirings 170 may include a first upper wiring 170a, a second upper wiring 170b and a third upper wiring 170c according to an arrangement of the gate patterns 110a, 110b and 110c.

The upper wiring 170 may be electrically connected to the lower wiring 150 via the second contact 165.

In some embodiments, as illustrated in FIGS. 1 and 3, the first upper wiring 170a and the second upper wiring 170b may be electrically connected to the second lower wiring 150b via the second contact 165, and may be also electrically connected to the gate contact 125 via the first contact 135. Thus, the first upper wiring 170a and the second upper wiring 170b may be combined with the second lower wirings 150b, and the gate pick-up of the first gate pattern 110a or the second gate pattern 110b may be implemented through the gate contact 125.

In some embodiments, as illustrated in FIG. 3, the second contact 165, the first contact 135 and the gate contact 125 may substantially overlap each other along a height direction of the logic semiconductor device.

In some embodiments, as illustrated in FIG. 1, the third upper wiring 170c may be electrically connected to the first lower wiring 150a and/or the third lower wiring 150c via the second contact 165. Accordingly, the upper wiring 170 may serve as an input/output pin of the logic semiconductor device.

According to example embodiments as described above, each of the lower wiring 150 and the upper wiring 170 may extend only in one direction, and may be unidirectional. In some embodiments, the lower wiring 150 and the upper wiring 170 may not include a diverging portion or a protruding portion extending in a different direction. Thus, a patterning margin for forming the wirings may be obtained, and a process complexity may be reduced.

Additionally, the lower wiring 150 and the upper wiring 170 may be placed to cross each other at different wiring levels, and may be electrically connected to each other via contacts. Therefore, a resolution limit of a patterning process may be overcome, and wiring routings in the horizontal and vertical directions may be achieved.

Figure 4:
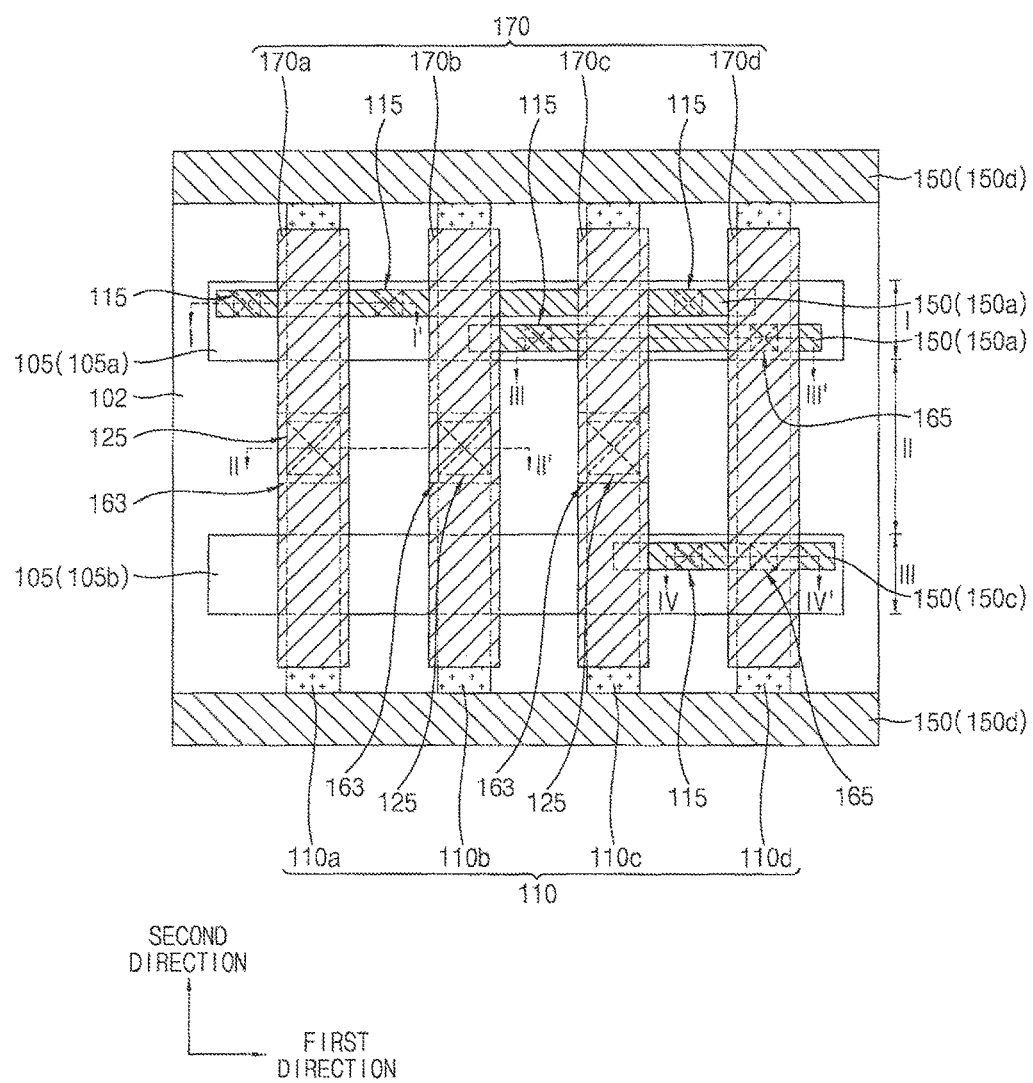
Figure 5:
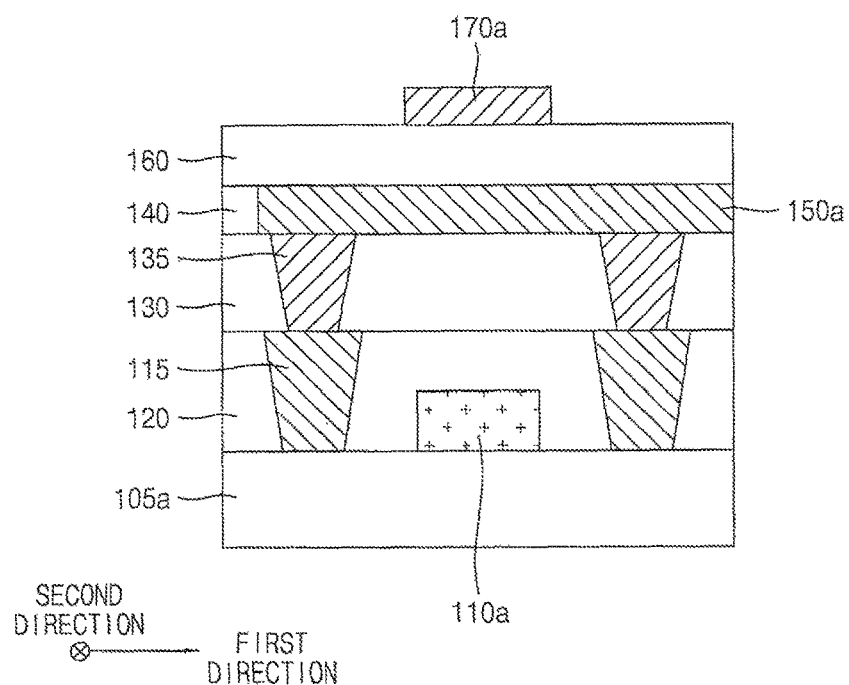

FIG. 4 is a top plan, view illustrating a logic semiconductor device in accordance with example embodiments of the inventive concept. FIGS. 5, 6, 7 and 8 are cross-sectional views taken along lines I-I', II-II', III-III' and IV-IV', respectively, indicated in FIG. 4.

The logic semiconductor device illustrated in FIGS. 4 to 8 may have elements and/or constructions substantially the same as or similar to those of the logic semiconductor device of FIGS. 1 to 3 except for constructions of wirings and contacts. Thus, detailed descriptions of repeated elements and/or structures are omitted herein, and like reference numerals are used to designate like elements.

Referring to FIGS. 4 to 8, as also described with reference to FIGS. 1 to 3, the logic semiconductor device may include a first region I, a second region II and a third region III provided as, a PMOS region, an STI region and an NMOS region, respectively. A first active pattern 105a and a second active pattern 105b may be disposed in the first region and the third region III, respectively. An isolation layer 102 may be exposed in the second region II.

The active pattern 105 may extend in the first direction, and a gate pattern 110 may extend in the second direction to cross a plurality of the active patterns 105. For example, the gate pattern 110 may include first to fourth gate patterns 110a to 110d arranged along the first direction.

A lower wiring 150 may extend in the first direction. In example embodiments, the second lower wiring 150b illustrated in FIGS. 1 to 3 may be omitted. Accordingly, the lower wiring 150 may include a first lower wiring 150a and a third lower wiring 150c disposed in the first region I and the third region III, respectively, and may not be disposed in the second region II. Additionally, a fourth lower wiring 150d serving as a power rail at a peripheral portion of the logic semiconductor device may be included in the lower wiring 150.

An upper wiring 170 may extend in the second direction, and may be substantially superimposed over the gate pattern 110. The upper wiring 170 may include first to fourth upper wirings 170a to 170d according to an arrangement of the gate patterns 110a to 110d.

The first lower wiring 150a and the third lower wiring 150c may be electrically connected to, e.g., an impurity region formed at an upper portion of the active pattern 105 via an active contact 115 and a first contact 135.

Figure 6:
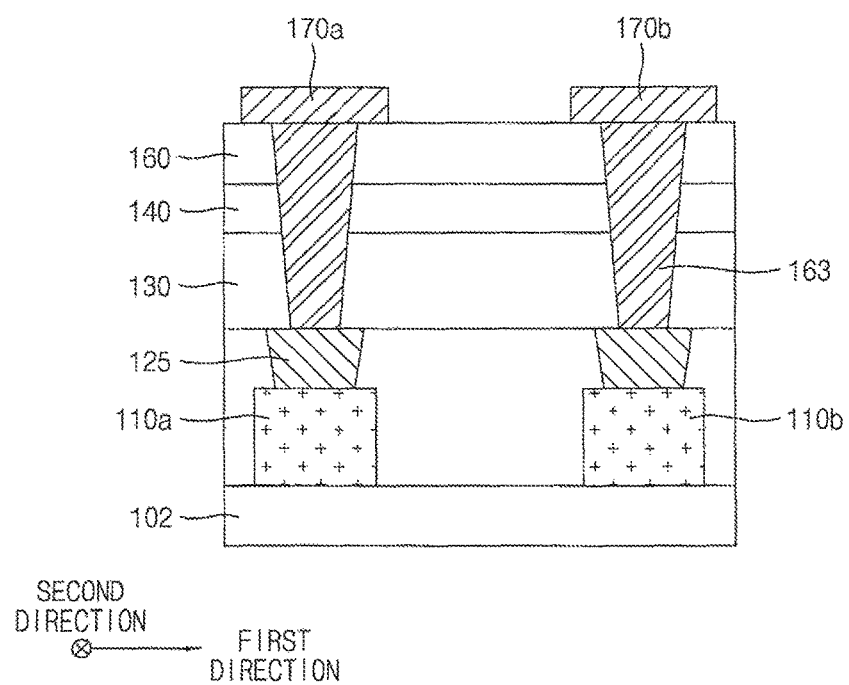

As illustrated in FIGS. 4 and 6, for example, a gate contact 125 may be disposed on a portion in the second region II of each first to third gate patterns 110a, 110b and 110c.

In example embodiments, the first to third upper wirings 170a, 170b and 170c may be electrically connected to the first to third gate patterns 110a, 110b and 110c, respectively, via a through contact 163.

The through contact 163 may extend through a plurality of wiring levels or a plurality of insulating interlayers to be in contact with a top surface of the gate contact 125. The through contact 163 may have a length or a height greater than that of each of the active contact 115, the first contact 135 and a second contact 165.

In some embodiments, the through contact 163 may extend through third to first insulating interlayers 160, 140 and 130 to be disposed on the gate contact 125.

For example, the fourth upper wiring 170d may be electrically connected to the first lower wiring 150a and/or the third lower wiring 150c via the second contact 165. Accordingly, the upper wiring 170 may serve as an input/output pin of the logic semiconductor device.

According to example embodiments as described above, the lower wiring 150 may be omitted in the second region II, and the upper wiring 170 may be directly connected to the gate contact 125 via the through contact 163. Thus, a patterning margin for the lower wiring 150 may be obtained while implementing a gate pick-up operation.

Figure 9:
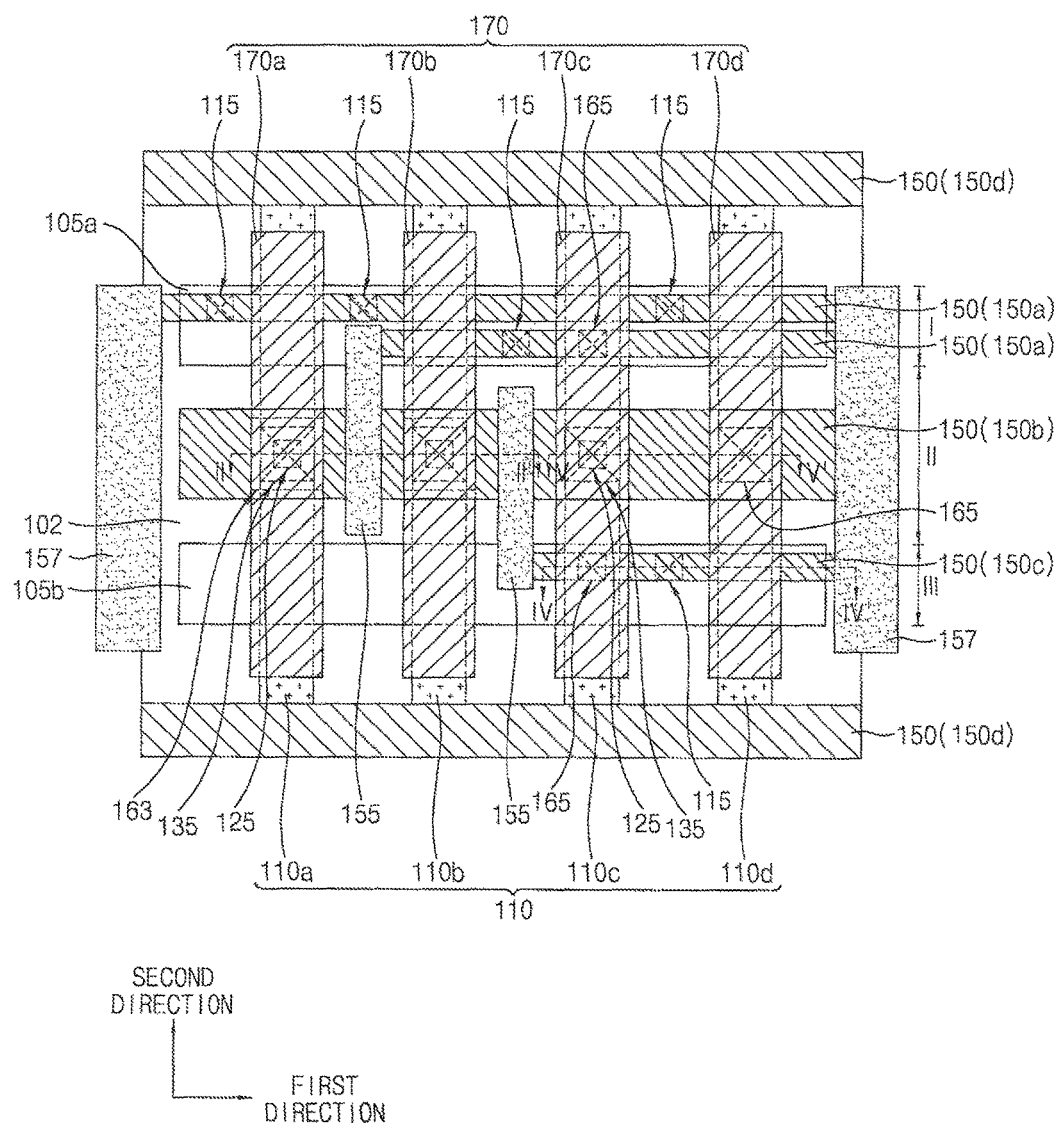
Figure 10:
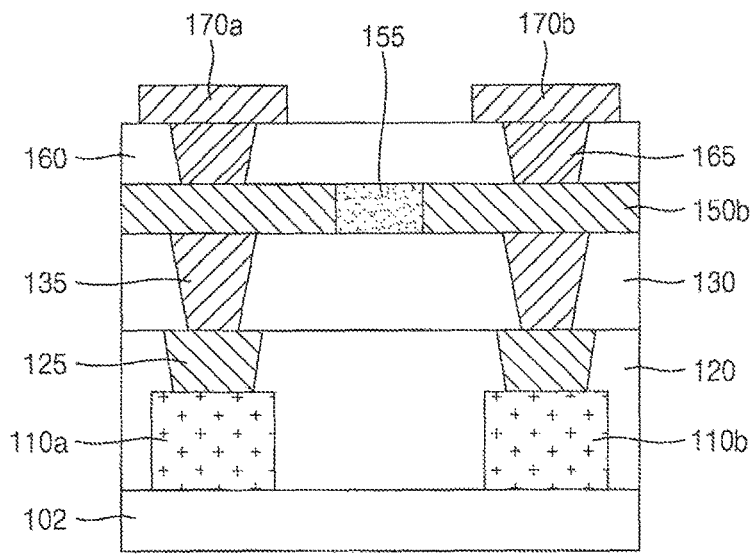
Figure 11:
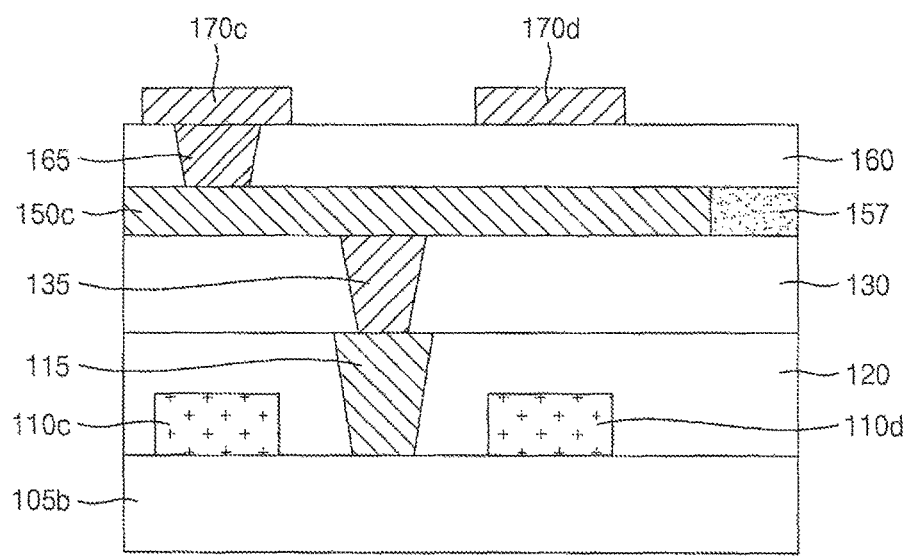
Figure 12:
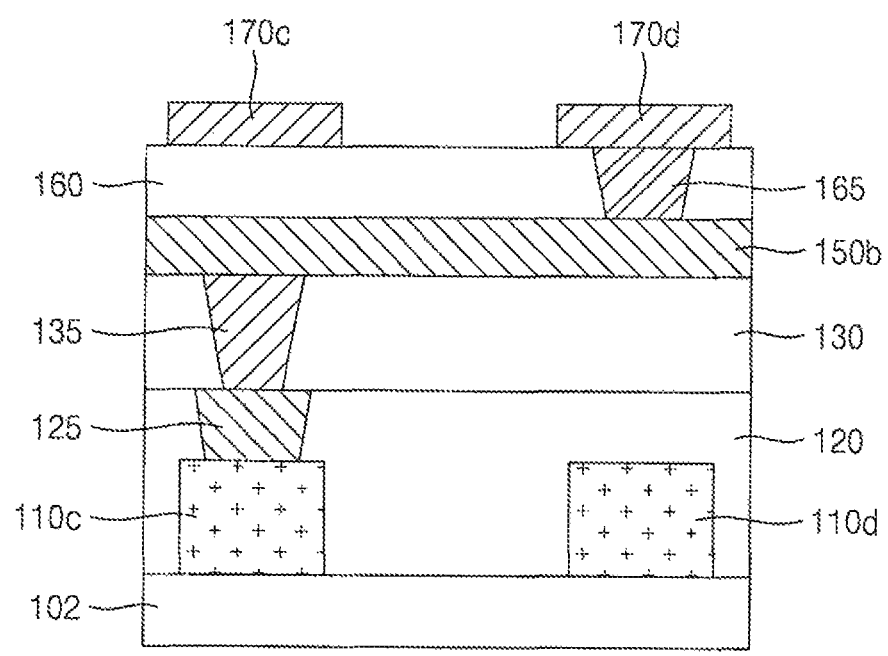

FIG. 9 is a top plan view illustrating a logic semiconductor device in accordance with example embodiments of the inventive concept. FIGS. 10, 11 and 12 are cross-sectional views taken along lines II-II', IV-IV' and V-V', respectively, indicated in FIG. 9.

The logic semiconductor device illustrated in FIGS. 9 to 12 may have elements and/or constructions substantially the same as or similar to those of the logic semiconductor device of FIGS. 1 to 3 and/or FIGS. 4 to 8 except for a construction of wirings and an addition of an insulation block. Thus, detailed descriptions of repeated elements and/or structures are omitted herein, and like reference numerals are used to designate like elements.

Referring to FIGS. 9 to 12, as also described with reference to FIGS. 1 to 3 or FIGS. 4 to 8, the logic semiconductor device may include a first region I, a second region II and a third region III provided as, e.g., a PMOS region, an STI region and an NMOS region, respectively. A first active pattern 105a and a second active pattern 105b may be disposed in the first region I and the third region III, respectively. An isolation layer 102 may be exposed in the second region II.

The active pattern 105 may extend in the first direction, and a gate pattern 110 may extend in the second direction. The gate pattern 110 may cross a plurality of the active patterns 105. For example, the gate pattern 110 may include first to fourth gate patterns 110a to 110d arranged along the first direction.

Lower wirings 150 may include first to fourth lower wirings 150a to 150d. The first lower wiring 150a, the second lower wiring 150b and the third lower wiring 150c may be disposed in the first region I, the second region II and the third region III, respectively. Additionally, a fourth lower wiring 150d may be included in the lower wirings 150. The fourth lower wiring 150d may be disposed at a peripheral portion of the logic semiconductor device, and may serve as a power rail.

In example embodiments, the lower wirings 150 may be cut or separated by insulation blocks 155 and 157. The insulation blocks may include a first insulation block 155 and a second insulation block 157.

As illustrated in FIGS. 10 and 11, the insulation blocks 155 and 157 may be disposed on a first insulating interlayer 130, and may be at substantially the same level as that of the lower wiring 150. For example, the insulation blocks 155 and 157 may include silicon oxide, silicon nitride or silicon oxynitride.

The second insulation blocks 157 may be disposed at both end portions or peripheral portions in the first direction of the logic semiconductor device. The lower wirings 150 may be segmented per each logic standard cell by the second insulation blocks 157.

In example embodiments, the second lower wiring 150b may be cut or divided by at least one first insulation block 155. For example, as illustrated in FIG. 1, the second lower wiring 150b may be divided into three fragments by two first insulation blocks 155.

In some embodiments, the second lower wiring 150b may have a width (e.g., a width in the second direction) greater than that of each first and third lower wirings 150a and 150c. In an embodiment, one second lower wiring 150b extending in the first direction may be disposed in the second region II, and may be divided into a plurality of fragments (e.g., the three fragments) by the first insulation blocks 155.

The second lower wiring 150b may be divided by the first insulation block 155, so that a gate pick-up may be implemented per each gate pattern 110 (e.g., the first gate pattern 110a and the second gate pattern 110b). Thus, the gate pickup may be implemented without forming a plurality of the second lower wirings 150b along the second direction as illustrated in FIG. 1. Therefore, the width of the second lower wiring 150b in the second region II may be relatively increased, and a patterning margin for forming the wiring may be additionally obtained.

In some embodiments, a gate pick-up unit including a gate contact 125, a first contact 135 and a second contact 165 may be divided by the first insulation block 155, and a plurality of the gate pick-up units may be arranged along the first direction in the second region II.

An upper wiring 170 may extend in the second direction, and may be substantially superimposed over the gate pattern 110. Thus, first to fourth upper wirings 170a to 170d may be arranged according to an arrangement of the first to fourth gate patterns 110a to 110d.

The upper wirings 170 may serve as, e.g., input/output pins, and the input/output pin may be connected to each fragment of the second lower wiring 150b divided by the first insulation block 155. For example, the gate contact 125 may be disposed on each first and second gate patterns 110a and 110*b*, and the fragment of the second lower wiring 150*b* may be electrically connected to the gate contact 125 via the first contact 135. Each of the first upper wiring 170*a* and the second upper wiring 170*b* may be electrically connected to the fragment of the second lower wiring 150*b* via the second contact 165.

In some embodiments, as illustrated in FIG. 10, the gate contact 125, the first contact 135 and the second contact 165 may overlap each other in a height direction of the logic semiconductor device on the first gate pattern 110*a* and the second gate pattern 110*b*.

The second contacts 165 for connecting the input/output pins on the third gate pattern 110*c* and the fourth gate pattern 110*d* may be 2-dimensionally distributed in a plan view. For example, the second contacts 165 for connecting the input/output pins on the third gate pattern 110*c* may face each other with respect to the second lower wiring 150*b* and the first contact 135. The second contact 165 for connecting the input/output pins on the fourth gate pattern 110*d* may be disposed directly on the second lower wiring 150*b* to be electrically connected to the fourth upper wiring 170*d*.

As described above, the second lower wiring 150*b* may be divided into a plurality of the fragments by the first insulation block 155, and, thus, a pin swap may be realized. Thus, a reduction of a patterning margin due to an overlap of the lower wiring 150 and the second contact 165 may be mitigated.

Figure 13:
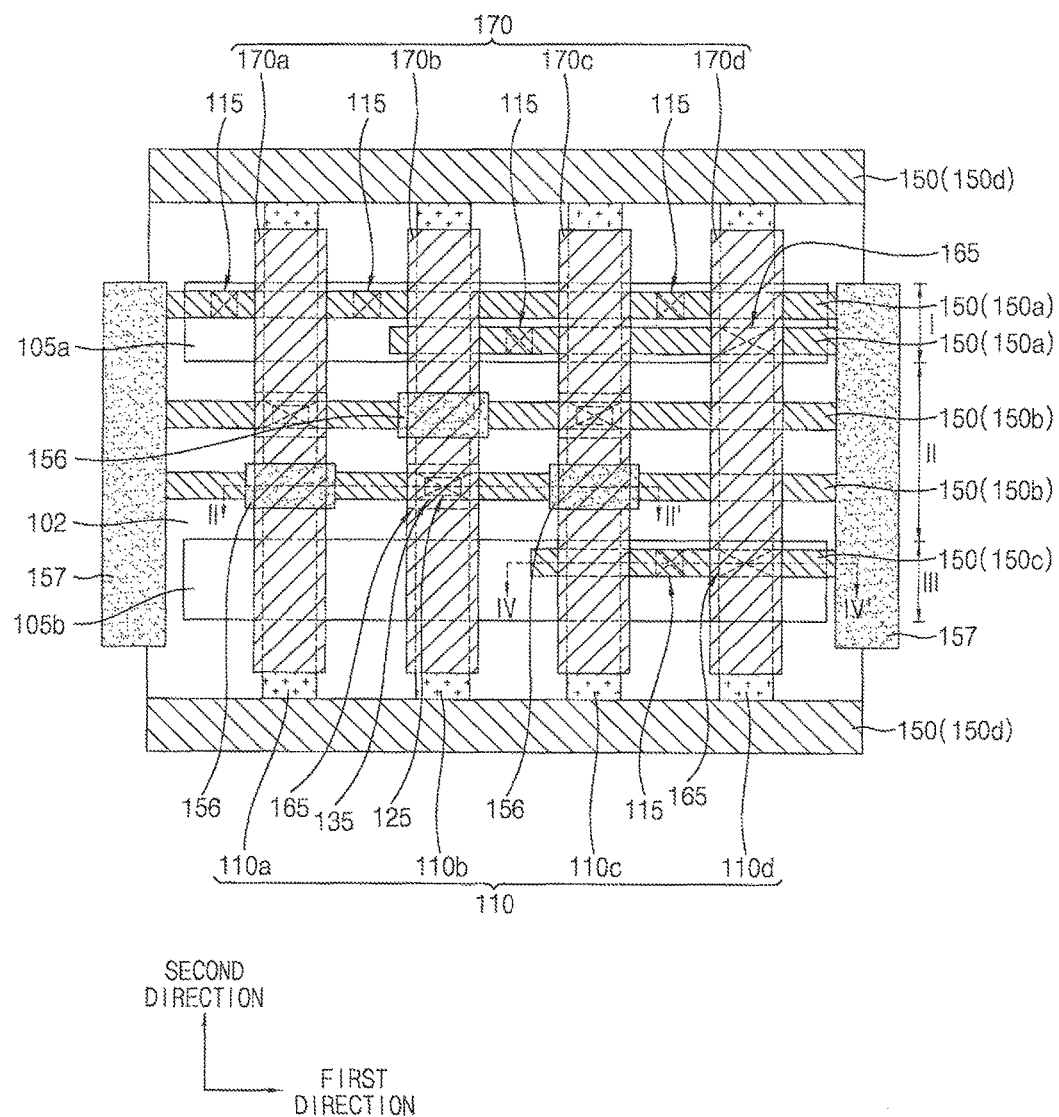
Figure 14:
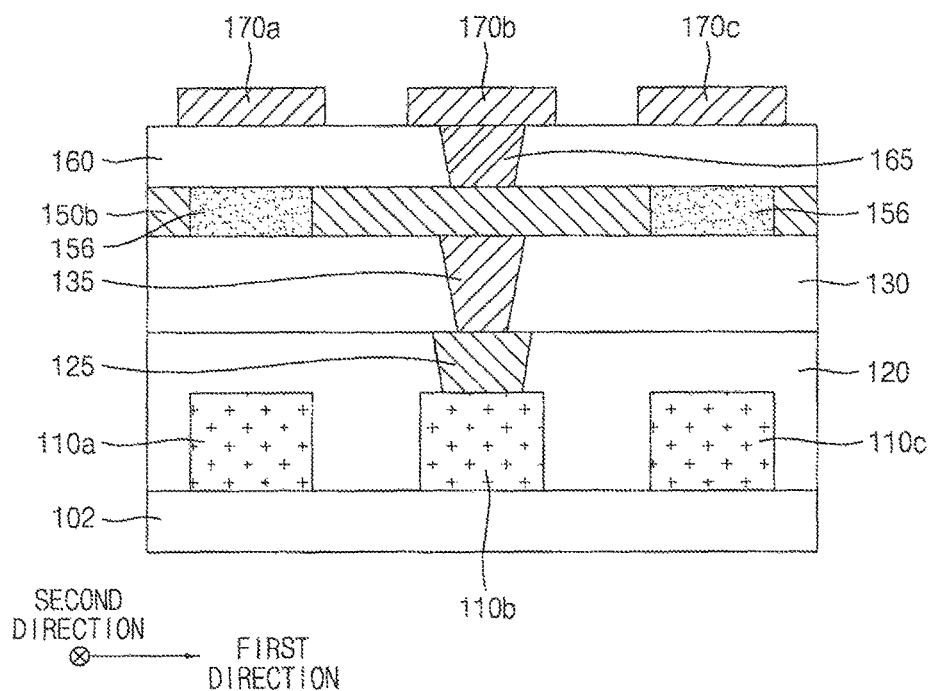
Figure 15:
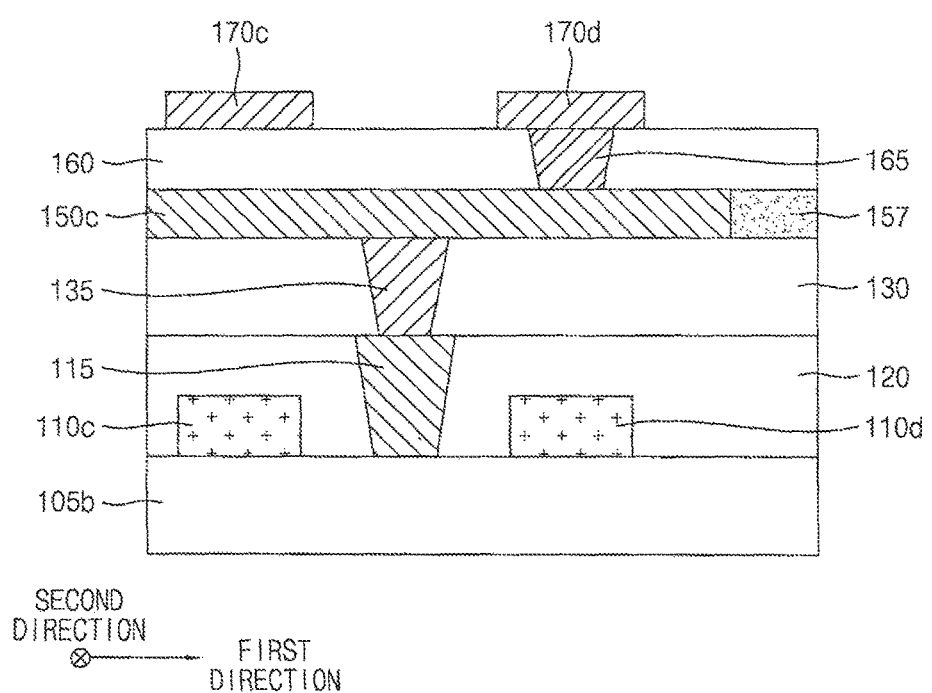

FIG. 13 is a top plan view illustrating a logic semiconductor device in accordance with example embodiments of the inventive concept. FIGS. 14 and 15 are cross-sectional views taken along lines II-II' and IV-IV', respectively, indicated in FIG. 13.

The logic semiconductor device illustrated in FIGS. 13 to 15 may have elements and/or constructions substantially the same as or similar to those of the logic semiconductor device of FIGS. 1 to 3 and/or FIGS. 9 to 12 except for constructions of wirings and insulation blocks. Thus, detailed descriptions of repeated elements and/or structures are omitted herein, and like reference numerals are used to designate like elements.

Referring to FIGS. 13 to 15, as also described with reference to FIGS. 1 to 3 or FIGS. 9 to 12, the logic semiconductor device may include a first region I, a second region II and a third region III provided as, e.g., a PMOS region, an STI region and an NMOS region, respectively. A first active pattern 105*a* and a second active pattern 105*b* may be disposed in the first region I and the third region III, respectively. An isolation layer 102 may be exposed in the second region II.

The active pattern 105 may extend in the first direction, and a gate pattern 110 may extend in the second direction. The gate pattern 110 may cross a plurality of the active patterns 105. For example, the gate pattern 110 may include first to fourth gate patterns 110*a* to 110*d* arranged along the first direction.

Lower wirings 150 may extend in the first direction. The lower wirings 150 may include a first lower wiring 150*a*, a second lower wiring 150*b* and a third lower wiring 150*c* disposed in the first region I, the second region II and the third region III, respectively. Additionally, a fourth lower wiring 150*d* may be included in the lower wirings 150. The fourth lower wiring 150*d* may be disposed at a peripheral portion of the logic semiconductor device, and may serve as a power rail.

As also illustrated in FIG. 1, a plurality of the second lower wirings 150*b* may be disposed in the second region II. As also illustrated in FIGS. 9 to 12, insulation blocks 156 and 157 may be provided to cut or divide the lower wirings 150. The insulation blocks may include a first insulation block 156 and a second insulation block 157.

The second insulation blocks 157, as also illustrated in FIGS. 9 to 12, may be disposed at both end portions or peripheral portions in the first direction of the logic semiconductor device to define or segment the lower wirings 150.

The first insulation blocks 156 may be disposed in the second region II to divide the second lower wirings 150*b*. In example embodiments, the first insulation blocks 156 may be disposed at some intersection areas of the gate patterns 110 and the second lower wirings 150*b*. The first insulation blocks 156 may be 2-dimensionally arranged in a plan view. For example, the first insulation blocks 156 may be arranged in a staggered configuration along the first direction.

Accordingly, gate pick-up units divided by the first insulation blocks 156 may be also arranged in a staggered configuration in the second region II. As illustrated in FIG. 14, the gate pick-up unit may include a gate contact 125, a first contact 135 and a second contact 165 overlapping in a height direction of the logic semiconductor device.

As described above, even when a plurality of the second lower wirings 150*b* (e.g., two second lower wirings 150*b*) may be disposed in the second region II, the second lower wirings 150*b* may be divided into a plurality of fragments utilizing the first insulation blocks 156. Accordingly, the gate pick-up units may be arranged 2-dimensionally or in the staggered configuration, and a pattering margin for forming the gate pick-up units may be increased.

Upper wirings 170 may extend in the second direction, and may include first to fourth upper wirings 170*a* to 170*d* according to an arrangement of the first to fourth gate patterns 110*a* to 110*d*.

In some embodiments, the first to third upper wirings 170*a*, 170*b* and 170*c* may be disposed over the first insulation blocks 156. The fourth upper wiring 170*d* may be electrically connected to the first lower wiring 150*a* and the third lower wiring 150*c* via the second contacts 165 for connecting an input/output pin.

As also described with reference to FIGS. 9 to 12, a pin swap may be realized together with a gate pick-up separation by the first insulation blocks 156.

Figure 16:
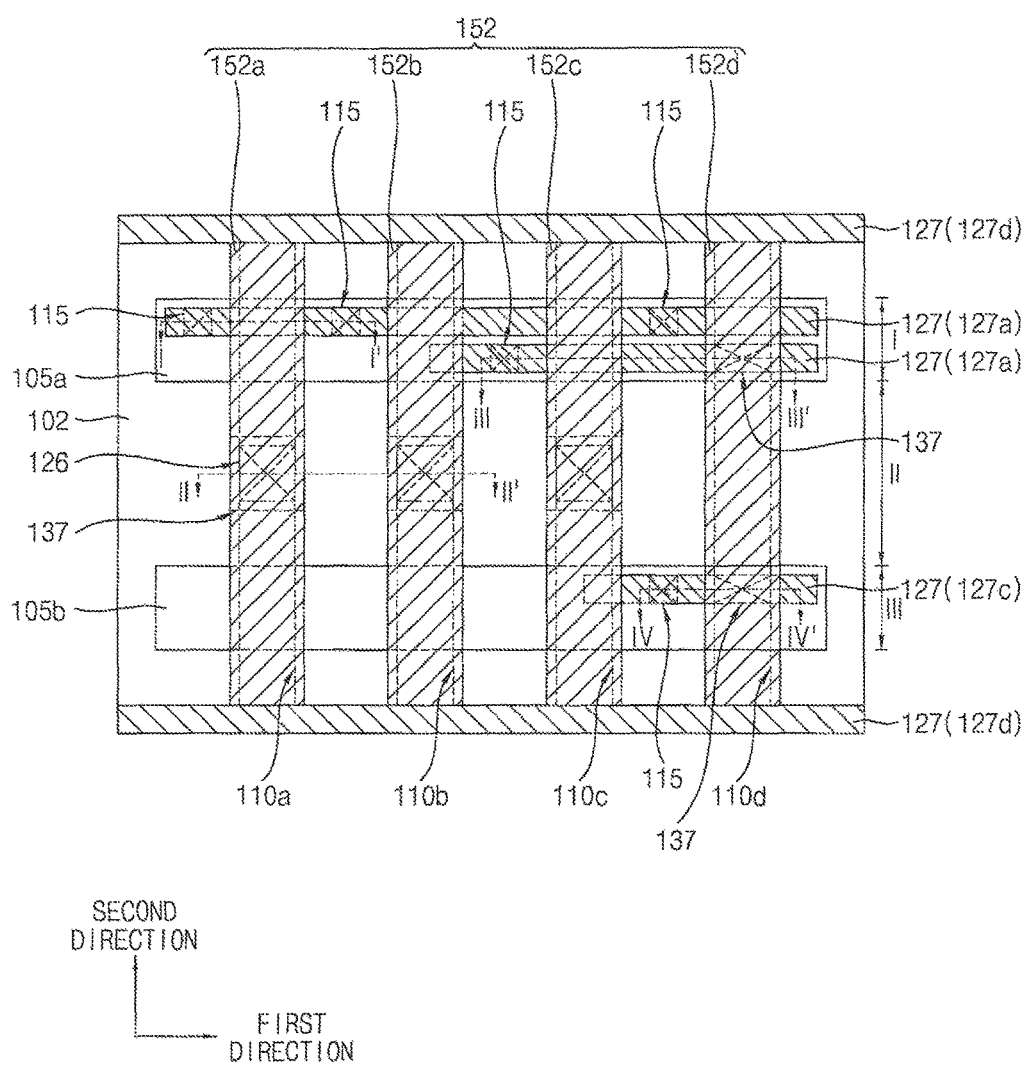

FIG. 16 is a top plan view illustrating a logic semiconductor device in accordance with example embodiments of the inventive concept. FIGS. 17, 18, 19 and 20 are cross-sectional views taken along lines I-I', II-II', III-III' and IV-IV', respectively, indicated in FIG. 16.

Referring to FIGS. 16 to 20, the logic semiconductor device may include a first region I, a second region II and a third region III provided as, e.g., a PMOS region, an STI region and an NMOS region, respectively. A first active pattern 105*a* and a second active pattern 105*b* may be disposed in the first region I and the third region III, respectively. An isolation layer 102 may be exposed in the second region II.

The active pattern 105 may extend in the first direction, and a gate pattern 110 may extend in the second direction. The gate pattern 110 may cross a plurality of the active patterns 105. For example, the gate pattern 110 may include first to fourth gate patterns 110*a* to 110*d* arranged along the first direction.

Figure 17:
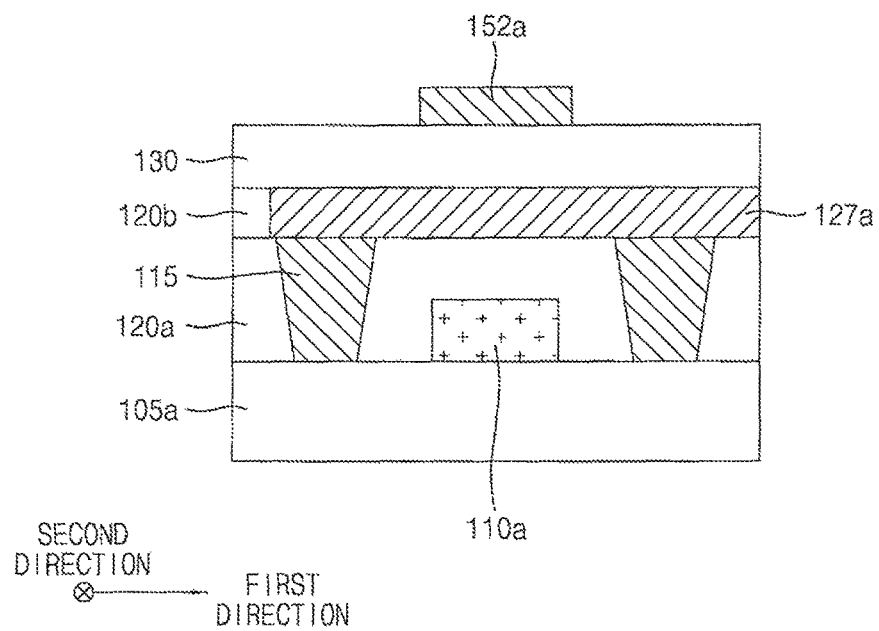

An active contact 115, as illustrated in FIG. 17, may extend in a first lower insulation layer 120*a* to be in contact with the active pattern 105. For example, the active contact 115 may be in contact with or electrically connected to an impurity region (not illustrated) formed at an upper portion of the active pattern 105 adjacent to the gate pattern 110.

A second lower insulation layer 120b may be formed on the first lower insulation layer 120a. A gate contact 126 may extend commonly through the second lower insulation layer 120b and the first lower insulation layer 120a to be in contact with or electrically connected to the gate pattern 110.

In some embodiments, the gate contact 126 may be provided per at least one gate pattern 110 of the gate patterns 110. For example, as illustrated in FIG. 16, one gate contact 126 may be provided per each of the first gate pattern 110a, the second gate pattern 110b and the third gate pattern 110c.

In example embodiments, sub-wirings 127 extending in the first direction (e.g., the direction of the active pattern 105) may be disposed on the first lower insulation layer 120a. The sub-wirings 127 may be formed in the second lower insulation layer 120b.

For example, as illustrated in FIG. 16, the sub-wirings 127 may include a first sub-wiring 127a and, a third sub-wiring 127c disposed in the first region I and the third region III, respectively. Additionally, two fourth sub-wirings 127d may be disposed at both peripheral portions in the second direction of the logic semiconductor device.

In some example embodiments, the sub-wiring 127 may be integral with the active contact 115. In this case, the sub-wiring 127 and the active contact 115 may be provided as a substantially unitary or monolithic member.

In some example embodiments, a top surface of the sub-wiring 127 may be coplanar with a top surface of the gate contact 126. In some embodiments, the sub-wiring 127 and the gate contact 126 may be formed by substantially the same deposition process and/or plating process.

In an embodiment, the active contact 115, the sub-wiring 127 and the gate contact 126 may be formed concurrently by a triple damascene process.

As described above, a horizontal routing (e.g., in the direction of the active pattern 105 or in the first direction) of the logic semiconductor may be achieved by the sub-wirings 127.

A first insulating interlayer 130 covering the sub-wirings 127 and the gate contact 126 may be formed on the second lower insulation layer 120b.

Lower wirings 152 may be disposed on the first insulating interlayer 130. The lower wirings 152 may extend over the sub-wirings 127 to cross a plurality of the sub-wirings 127.

In example embodiments, the lower wiring 152 may be substantially superimposed over the gate pattern 110, and may extend in the direction substantially the same as that of the gate pattern 110. For example, the lower wiring 152 may extend in the second direction, and a plurality of the lower wirings 152 may be arranged along the first direction.

The lower wiring 152 may include first to fourth lower wirings 152a, 152b, 152c and 152d according to an arrangement to the first to fourth gate patterns 110a, 110b, 110c and 110d.

In example embodiments, a vertical routing (e.g., in the direction of the gate pattern 110 or in the second direction) may be achieved by the lower wirings 152.

The lower wirings 152 may be electrically connected to the gate contact 126 or the sub-wiring 127 via first contacts 137 formed through the first insulating interlayer 130.

Figure 18:
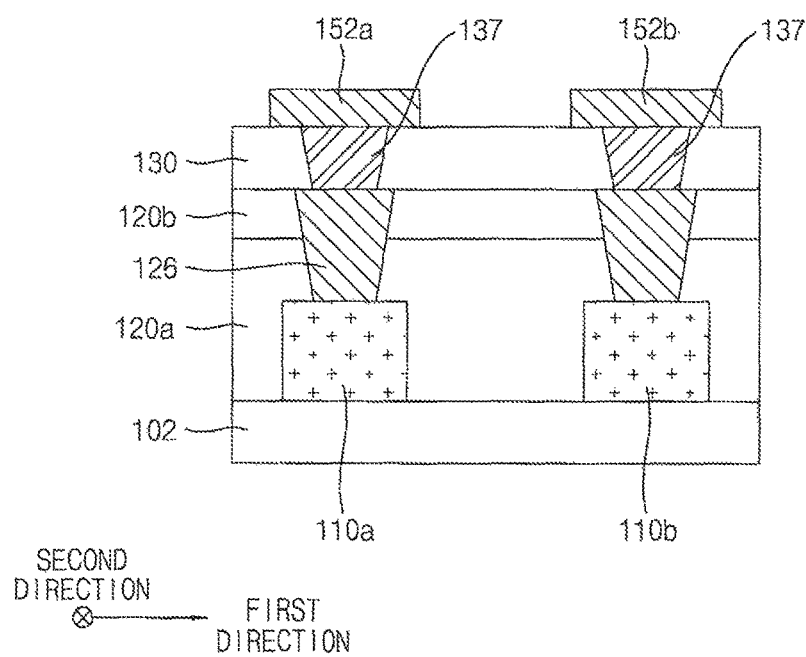

For example, as illustrated in FIGS. 16 and 18, the first lower wiring 152a, the second lower wiring 152b and the third lower wiring 152c may be electrically connected to each gate contact 126 via the first contact 137. Thus, a gate pick-up of the first gate pattern 110a, the second gate pattern 110b or the third gate pattern 110c may be realized by the first to lower wirings 152a, 152b and 152c, and the gate contact 126.

In some embodiments, the first contact 137 and the gate contact 126 may overlap each other along a height direction of the logic semiconductor device.

Figure 19:
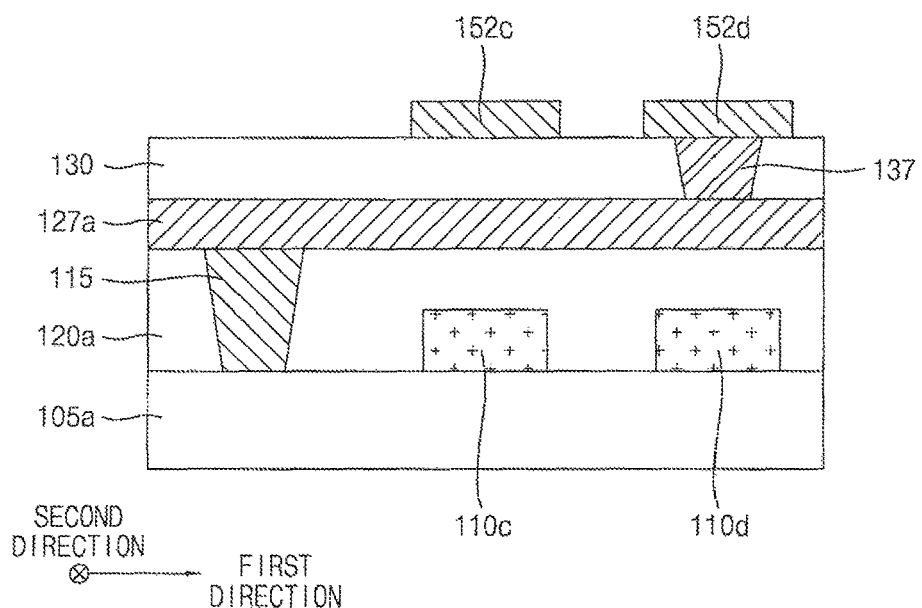
Figure 20:
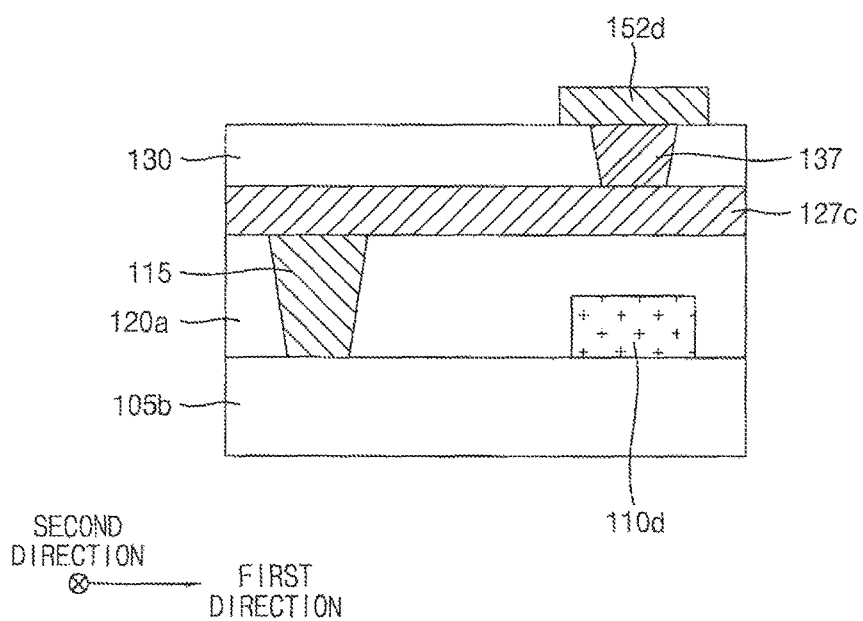

In some embodiments, as illustrated in FIGS. 16, 19 and 20, the fourth lower wiring 152d may be electrically connected to the first sub-wiring 127a and/or the third sub-wiring 127c via the first contact 137. Accordingly, the lower wiring 152 may serve as an input/output pin of the logic semiconductor device.

According to example embodiments as described above, a horizontal routing may be achieved by the sub-wirings 127 integrally connected to the active contact 115, and a vertical routing may be achieved by the lower wirings 152 disposed over the sub-wirings 127. Thus, even though the upper wirings 170 illustrated in FIGS. 1 to 3 may be omitted, a bidirectional routing of the logic semiconductor device may be realized. Further, a size of the logic semiconductor device may be reduced by the omission of the upper wirings 170.

In some embodiments, upper wirings may be additionally disposed. For example, the upper wirings may be electrically connected to the fourth sub-wiring 127d via a through contact extending through a plurality of insulation layers. In an embodiment, the upper wiring may be utilized as a power rail of the logic semiconductor device.

Figure 22:
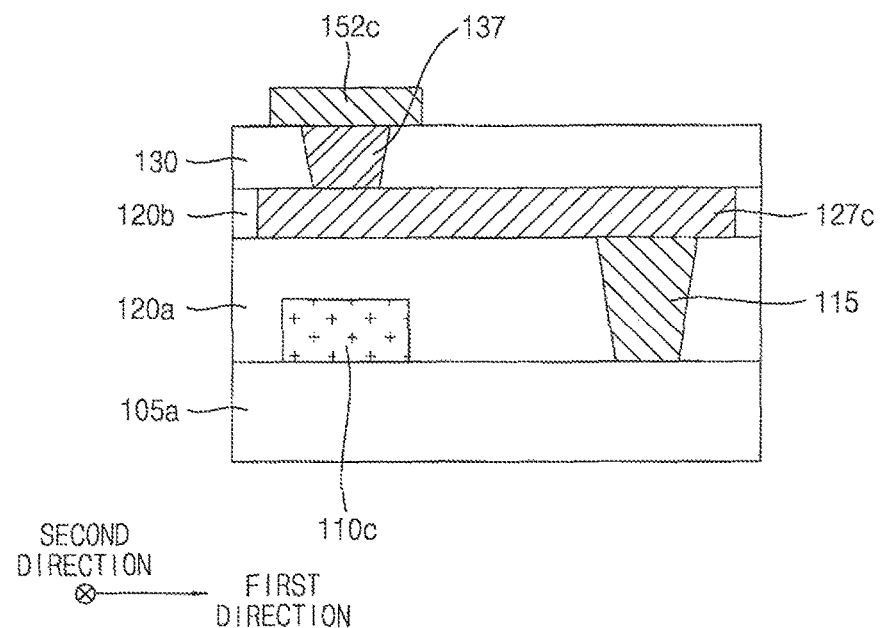
Figure 23:
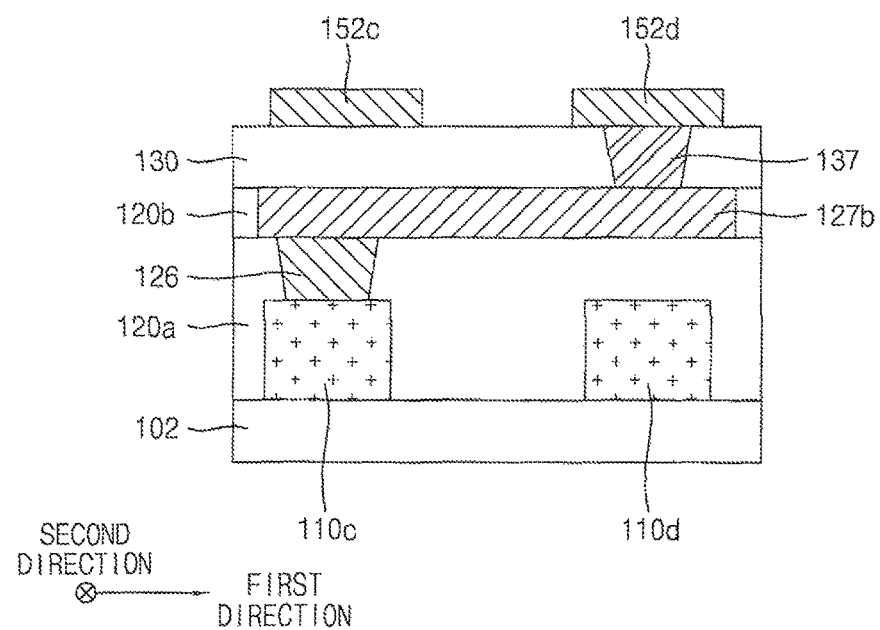

FIG. 21 is a top plan view illustrating a logic semiconductor device in accordance with example embodiments of the inventive concept. FIGS. 22 and 23 are cross-sectional views taken along lines IV-IV' and V-V', respectively, indicated in FIG. 21.

The logic semiconductor device illustrated in FIGS. 21 to 23 may have elements and/or constructions substantially the same as or similar to those of the logic semiconductor device of FIGS. 16 to 20 except for constructions of wirings and contacts in the second region II. Thus, detailed descriptions of repeated elements and/or structures are omitted herein, and like reference numerals are used to designate like elements.

Referring to FIGS. 21 to 23, as also described with reference to FIGS. 16 to 20, the logic semiconductor device may include sub-wirings 127 configured to implement a horizontal routing, and lower wirings 152 configured to implement a vertical routing.

The sub-wiring 127 and an active contact 115 may be connected to each other as a substantially unitary or monolithic member, and may be formed by a triple damascene process together with a gate contact 126.

In example embodiments, a second sub-wiring 127b may be disposed in the second region II. As illustrated in FIG. 23, for example, the second sub-wiring 127b may be electrically connected to a third gate pattern 110c via a gate contact 126, and may be electrically connected to a fourth lower wiring 152d via a first contact 137.

In some embodiments, the first contacts 137 for connecting an input/output pin may be 2-dimensionally distributed in a plan view on the third gate pattern 110c and the fourth gate pattern 110d. For example, the first contacts 137 for connecting the input/output pin on the third gate pattern 110c may face each other in the second direction with respect to the second sub-wiring 127b. The first contact 137 for connecting the input/output pin on the fourth gate pattern 110d may be disposed directly on the second sub-wiring 127b to be electrically connected to the fourth lower wiring 152d.

As described above, a pin swap may be realized by adding the second sub-wiring 127*b*. Thus, a reduction of a patterning margin due to an overlap of the sub-wiring 127 and the first contact 137 may be mitigated.

Figure 24:
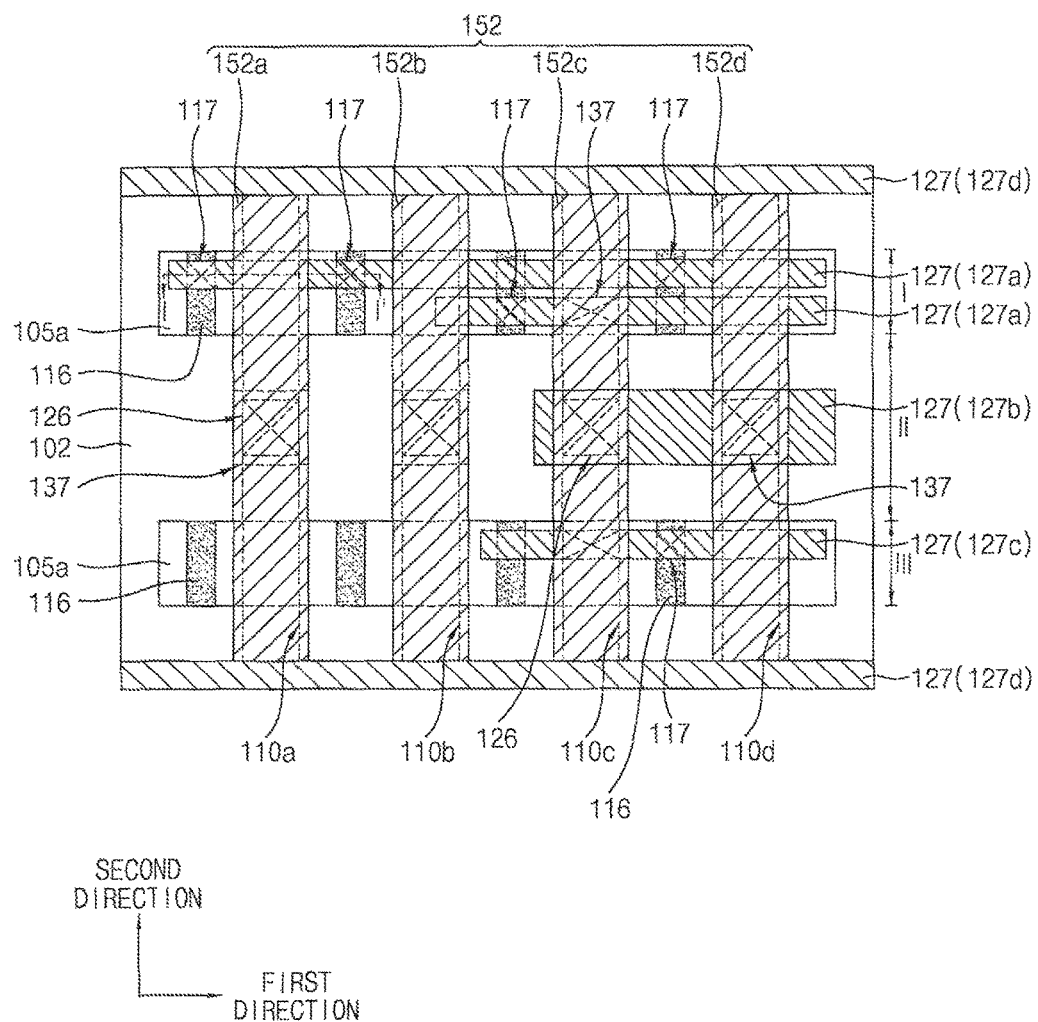
Figure 25:
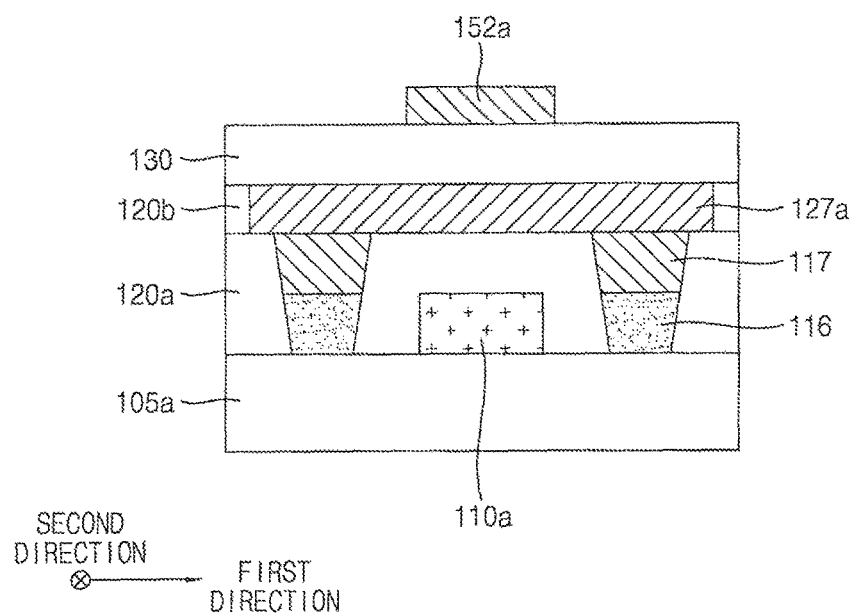

FIG. 24 is a top plan view illustrating a logic semiconductor device in accordance with example embodiments of the inventive concept. FIG. 25 is a cross-sectional view taken along a line I-I' indicated in FIG. 24.

The logic semiconductor device illustrated in FIGS. 24 and 25 may have elements and/or constructions substantially the same as or similar to those of the logic semiconductor device of FIGS. 21 to 23 except for an addition of a silicide pattern. Thus, detailed descriptions on repeated elements and/or structures are omitted herein, and like reference numerals are used to designate like elements.

Referring to FIGS. 24 and 25, a silicide pattern 116 may be formed at an upper portion of an active pattern 105 adjacent to a gate pattern 110. For example, a pair of the silicide patterns 116 may face each other with respect to one gate pattern 110.

In example embodiments, the silicide pattern 116 may be formed by thermally reacting a metal layer and the active pattern 105. For example, the silicide pattern 116 may include cobalt silicide (CoSi) or nickel silicide (NiSi).

An active contact 117 may be in contact with a top surface of the silicide pattern 116 in a first lower insulation layer 120*a*. A resistance between the active contact 117 and the active pattern 105 may be reduced by the silicide pattern 116.

In some embodiments, as also described with reference to FIGS. 16 to 20, a horizontal routing may be achieved by sub-wirings 127. A vertical routing may be achieved by lower wirings 152 disposed over the sub-wirings 127. The sub-wiring 127 and the active contact 117 may be connected to each other as a substantially unitary or monolithic member.

In some embodiments, as also described with reference to FIGS. 21 to 23, a second sub-wiring 127*b* may be disposed in the second region II, and a pin swap may be realized utilizing the second sub-wiring 127*b*.

In some example embodiments, as illustrated in FIGS. 1 to 15, the sub-wirings may be omitted, and the horizontal and vertical routings may be achieved by lower and upper wirings.

FIGS. 26 to 44 are top plan views and cross-sectional views illustrating a method of manufacturing a semiconductor device in accordance with example embodiments of the inventive concept.

Figure 26:
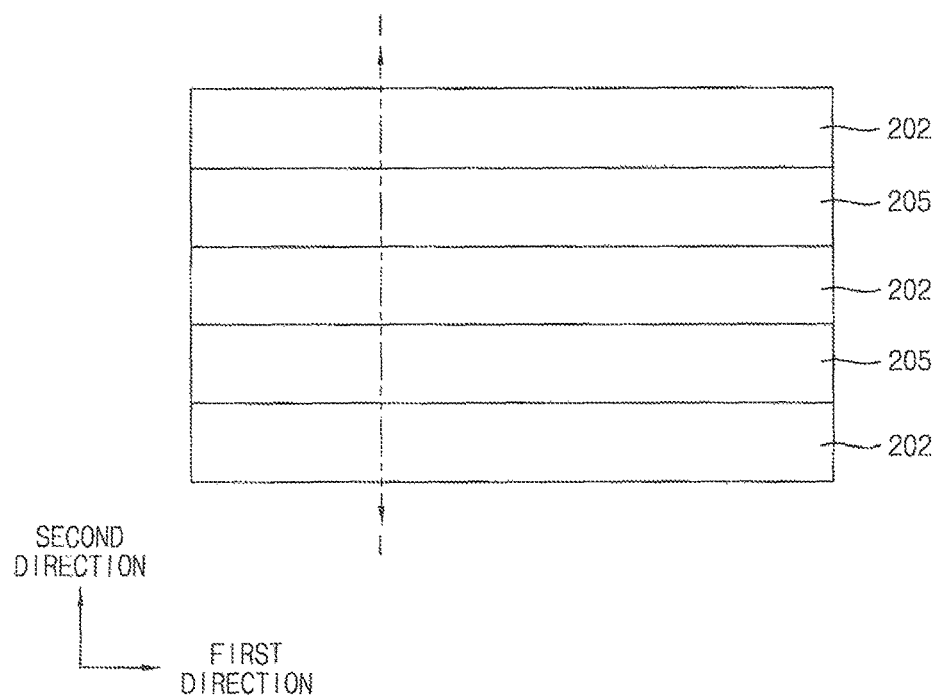
Figure 27:
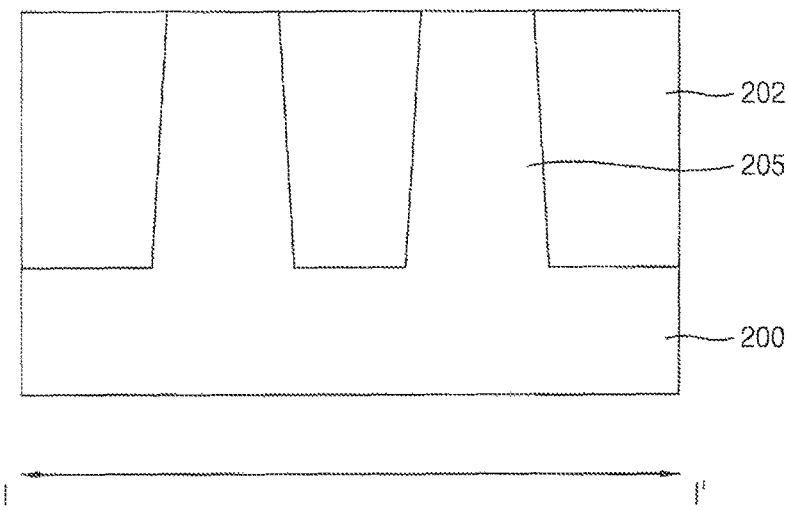
Figure 28:
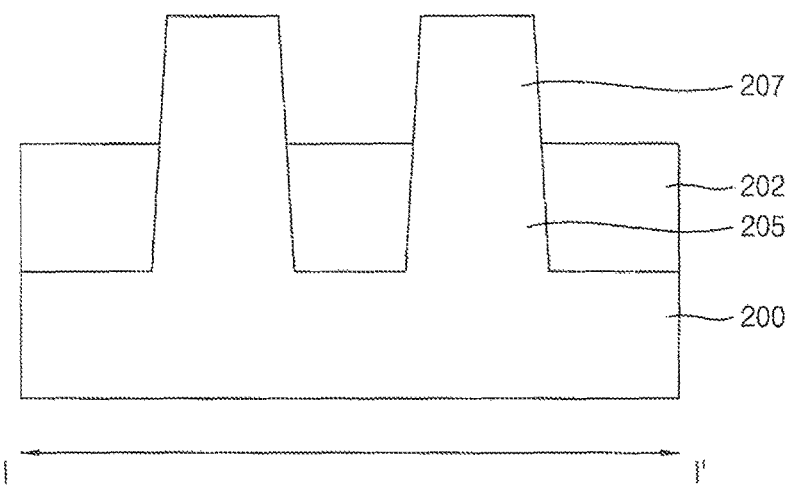
Figure 29:
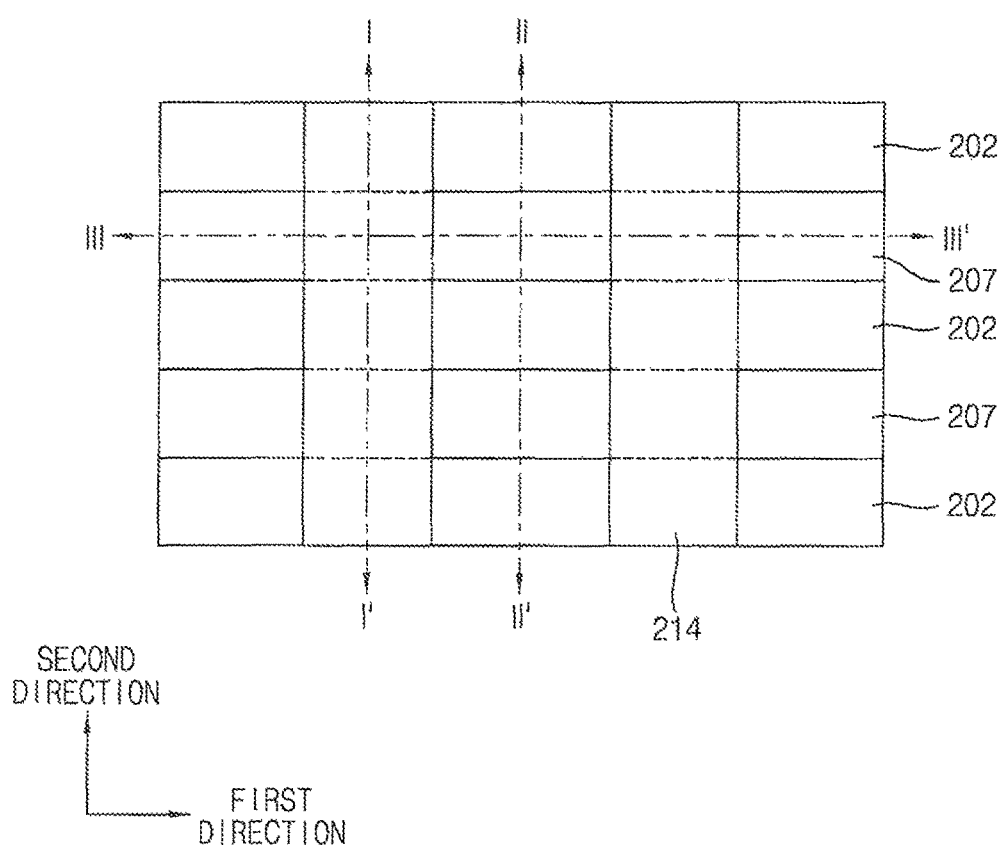
Figure 31:
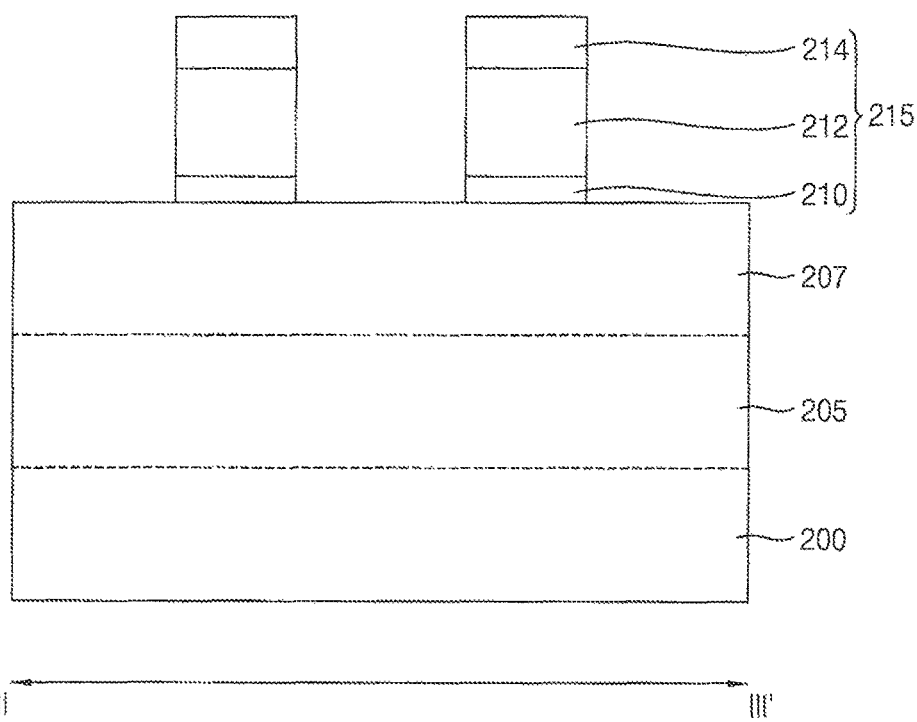
Figure 32:
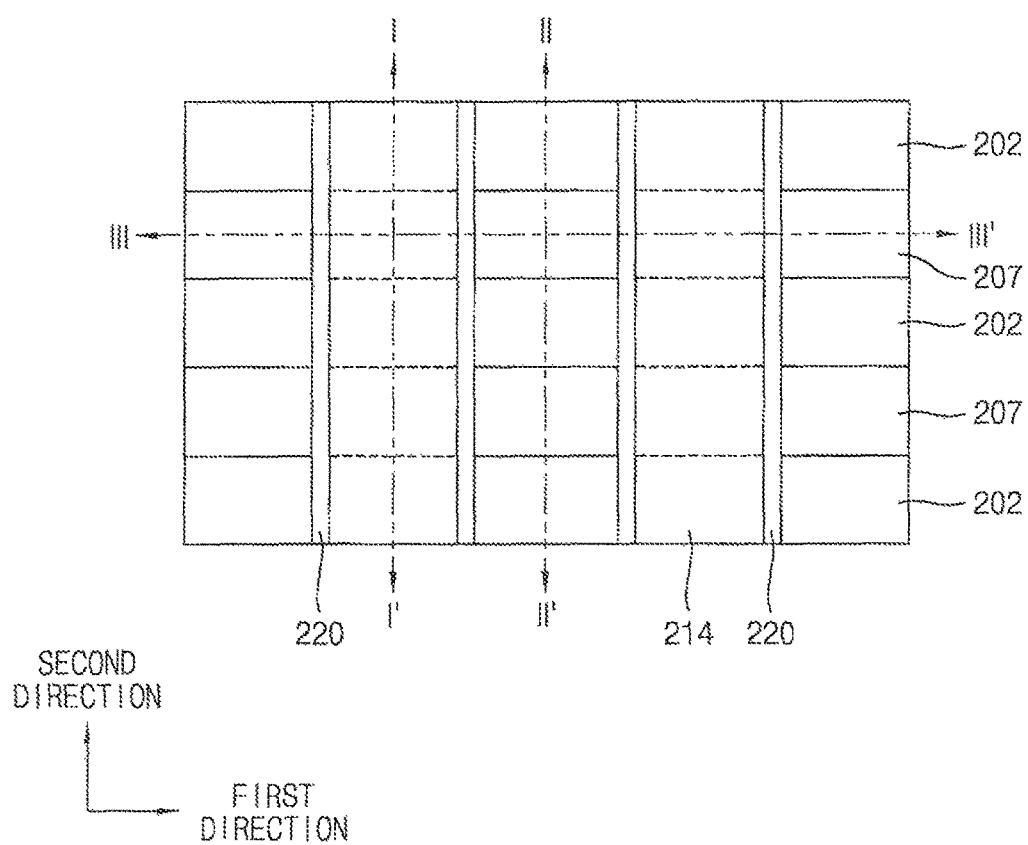

Specifically, FIGS. 26, 29 and 32 are top plan views illustrating the method. FIGS. 27 and 28 are cross-sectional views taken along a line I-I' indicated in FIG. 26, FIGS. 30, 34, 36 and 40 include cross-sectional views taken along lines I-I' and II-II' indicated in FIGS. 29 and 32. FIGS. 31, 33, 37 to 39, and 41 to 44 are cross-sectional views taken along a line III-III' indicated in FIGS. 29 and 32.

FIGS. 26 to 44 illustrate a method of manufacturing a semiconductor device that may include a fin field-effect transistor (FinFET). For example, elements and manufacturing processes of the logic semiconductor devices illustrated in FIGS. 1 to 25 will be described in more detail with reference to FIGS. 26 to 44.

The definitions of first and second directions used in FIGS. 1 to 25 are also applied in FIGS. 26 to 44.

Referring to FIGS. 26 and 27, an active pattern 205 protruding from a substrate 200 may be formed.

The substrate 200 may include a semiconductor material, such as Si, Ge, Si—Ge or a group III-V compound, such as InP, GaP, GaAs, GaSb, etc. In some embodiments, the substrate 200 may include a silicon-on-insulator (SOI) substrate or a germanium-on-insulator (GOI) substrate.

In example embodiments, the active pattern 205 may be formed by a shallow trench isolation (STI) process. For example, an upper portion of the substrate 200 may be partially etched to form an isolation trench, and then an insulation layer sufficiently filling the isolation trench may be formed on the substrate 200. An upper portion of the insulation layer may be planarized by, e.g., a CMP process until a top surface of the substrate 200 may be exposed to form an isolation layer 202. The insulation layer may be formed of, e.g., silicon oxide.

A plurality of protrusions may be formed from the substrate 200 defined by the isolation layer 202. The protrusions may be defined as the active patterns 205. As described with reference to FIGS. 1 to 25, each active pattern 205 may extend linearly in the first direction, and a plurality of the active patterns 205 may be formed along the second direction. A portion of the isolation layer 202 between the active patterns 205 may correspond to the second region II in FIGS. 1 to 25.

In some embodiments, an ion-implantation process may be performed to form a well at an upper portion of the active pattern 205.

In some embodiments, the active pattern 205 may be formed from an additional channel layer. In this case, the channel layer may be formed on the substrate 200 by, e.g., a selective epitaxial growth (SEG) process, and an STI process may be performed on the channel layer to form the active pattern 205. While performing the SEG process, a silicon source, such as silane, may be used together with a germanium source or a carbon source so that a stress may be applied to the channel layer.

Referring to FIG. 28, an upper portion of the isolation layer 202 may be removed by, e.g., an etch-back process so that an upper portion of the active pattern 205 may be exposed. The upper portion of the active pattern 205 exposed from a top surface of the isolation layer 202 may be defined as an active fin 207. The active fin 207 may extend in the first direction, and a plurality of the active fins 207 may be arranged along the second direction.

Figure 30:
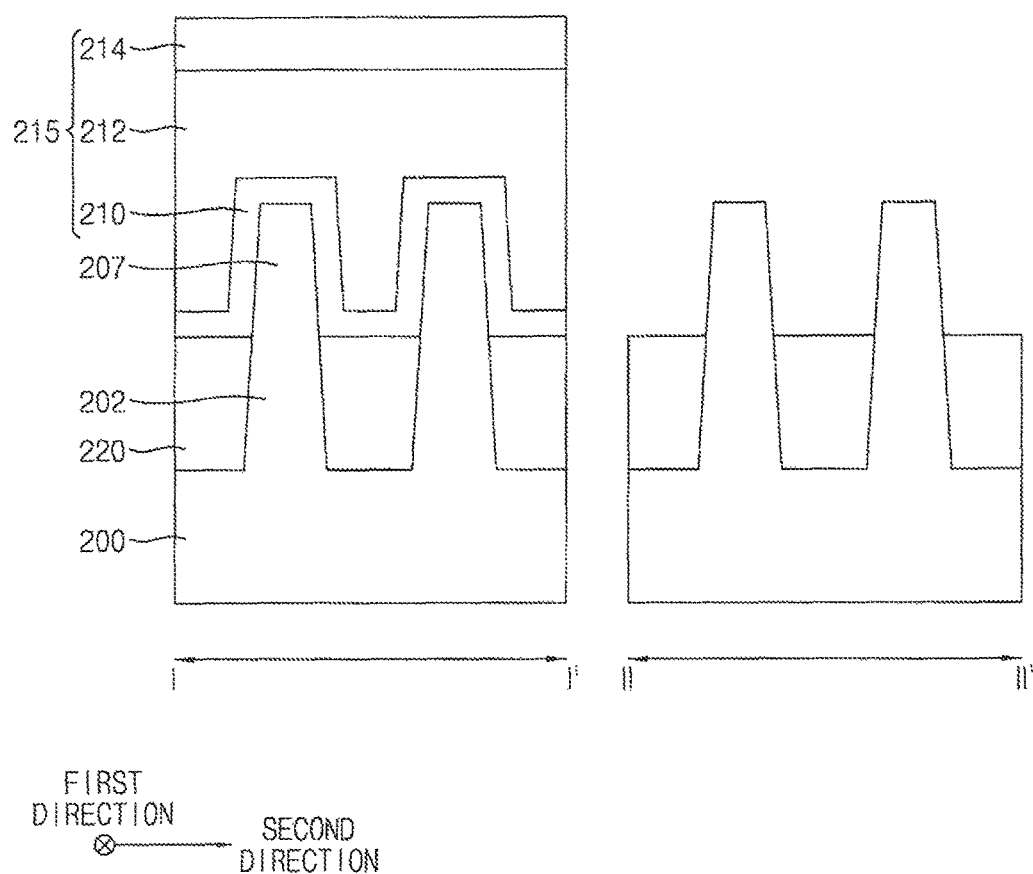

Referring to FIGS. 29, 30 and 31, a dummy gate structure 215 may be formed on the isolation layer 202 and the active fin 207.

For example, a dummy gale insulation layer, a dummy gate electrode layer and a dummy gate mask layer may be sequentially formed on the active fin 207 and the isolation layer 202. The dummy gate mask layer may be patterned by a photo-lithography process to form a dummy gate mask 214. The dummy gate electrode layer and the dummy gate insulation layer may be partially removed using the dummy gate mask 214 as an etching mask to form the dummy gate structure 215.

The dummy gate structure 215 may include a dummy gate insulation pattern 210, a dummy gate electrode 212 and the dummy gate mask 214 sequentially stacked from the active fin 207 and the isolation layer 202.

For example, the dummy gate insulation layer may be formed of silicon oxide. The dummy gate electrode layer may be formed of polysilicon. The dummy gate mask layer may be formed of silicon nitride.

The dummy gate insulation layer, the dummy gate electrode layer and the dummy gate mask layer may be formed by a chemical vapor deposition (CVD) process, a sputtering process or an atomic layer deposition (ALD) process. In an embodiment, the dummy gate insulation layer may be formed by a thermal oxidation process on the active fin 207. In this case, the dummy gate insulation layer may be selectively formed on a top surface of the active fin 207.

In example embodiments, the dummy gate structure 215 may extend in the second direction, and may cross a plurality of the active fins 207. A plurality of the dummy gate structures 215 may be formed along the first direction.

Figure 33:
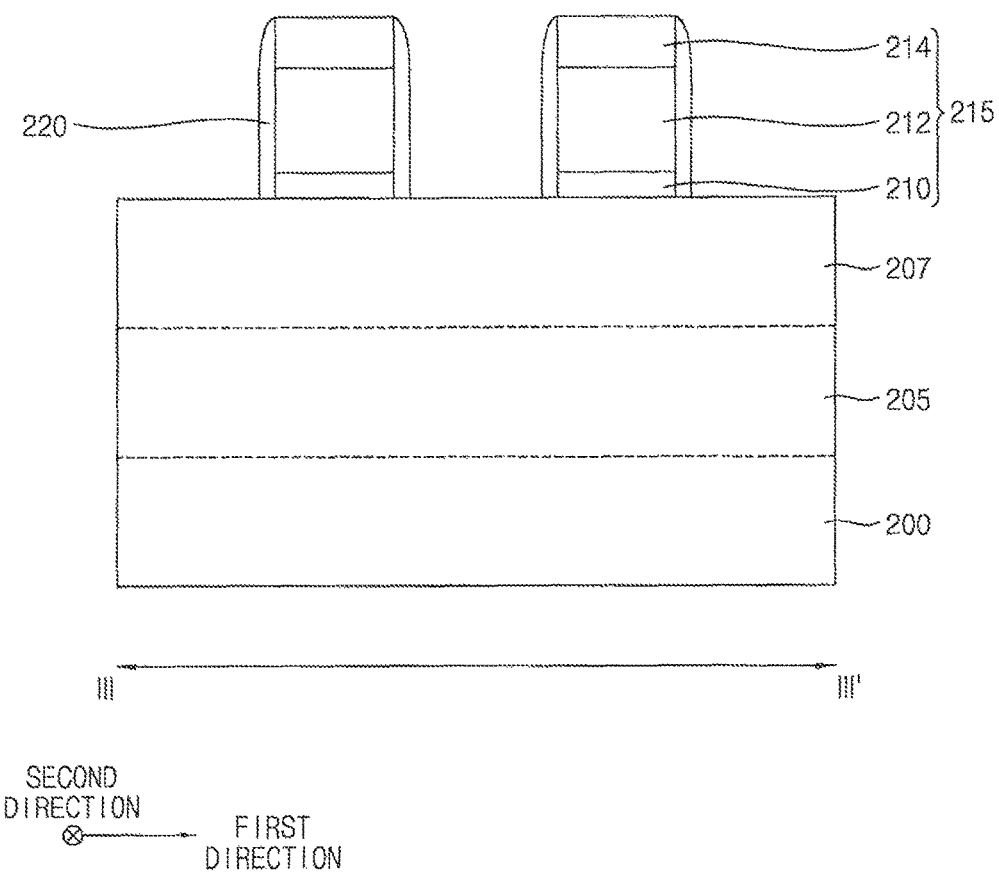

Referring to FIGS. 32 and 33, a gate spacer 220 may be formed on a sidewall of the dummy gate structure 215.

In example embodiments, a spacer layer may be formed on the dummy gate structure 215, the active fin 207 and the isolation layer 202, and the spacer layer may be anisotropically etched to form the gate spacer 220. The spacer layer may be formed of a nitride, e.g., silicon nitride, silicon oxynitride, silicon carbonitride, etc.

As illustrated in FIG. 32, the gate spacer 220 may extend in the second direction together with the dummy gate structure 215.

Figure 34:
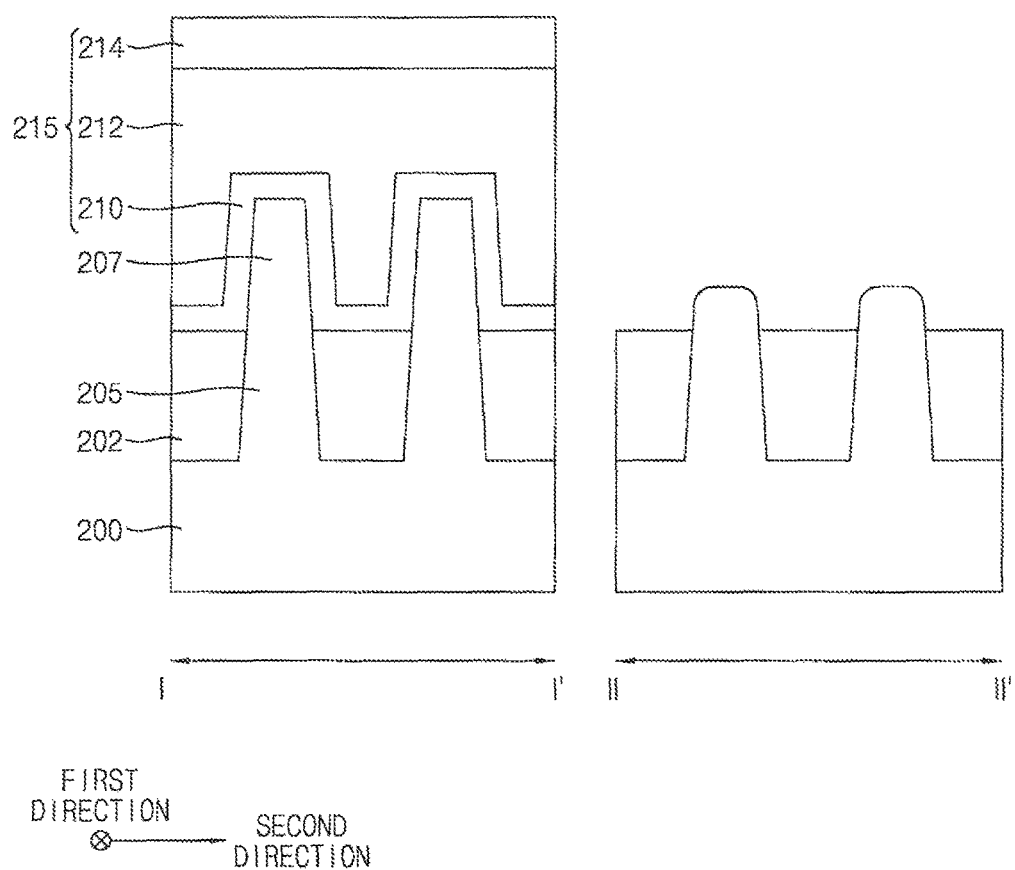
Figure 35:
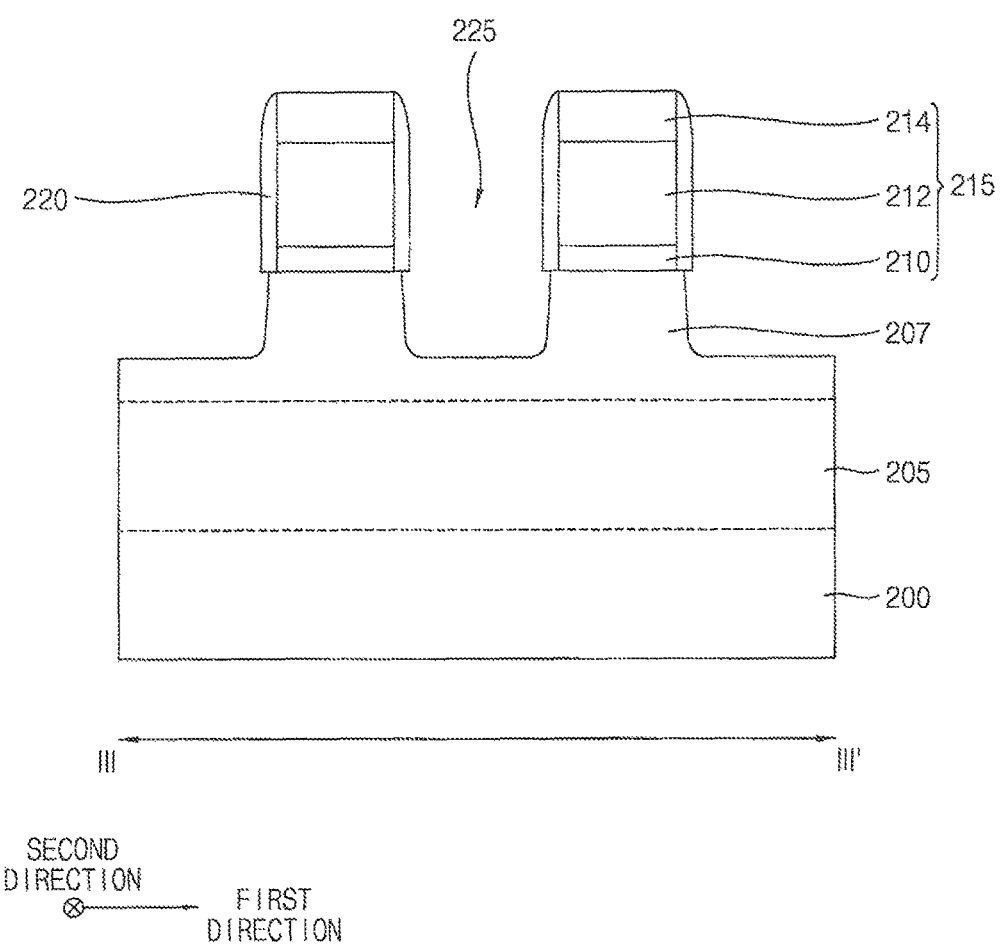

Referring to FIGS. 34 and 35, an upper portion of the active fin 207 adjacent to the gate spacer 220 and/or the dummy gate structure 215 may be etched to form a recess 225.

In the etching process for the formation of the recess 225, the gate spacer 220 may substantially serve as an etching mask. In example embodiments, an inner wall of the recess 225 may have a substantially "U"-shaped profile as illustrated in FIG. 35.

In some embodiments, the recess 225 may be expanded to a portion of the active pattern 205 below the top surface of the isolation layer 202.

Figure 36:
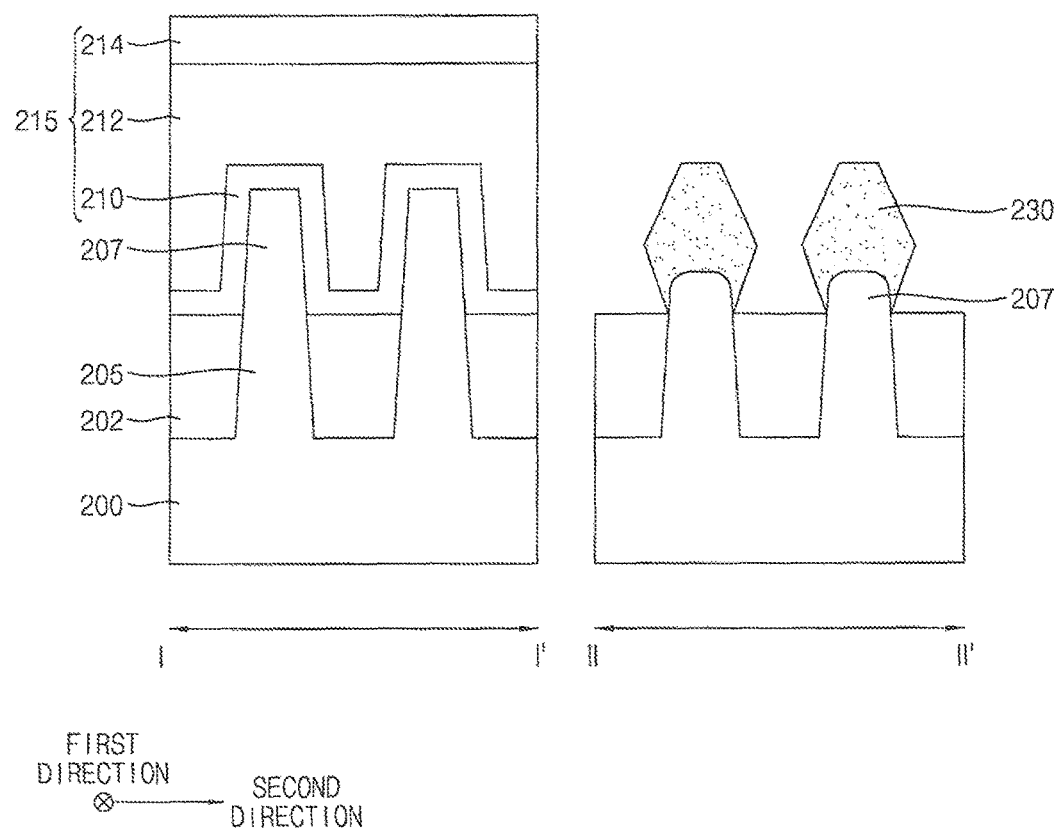
Figure 37:
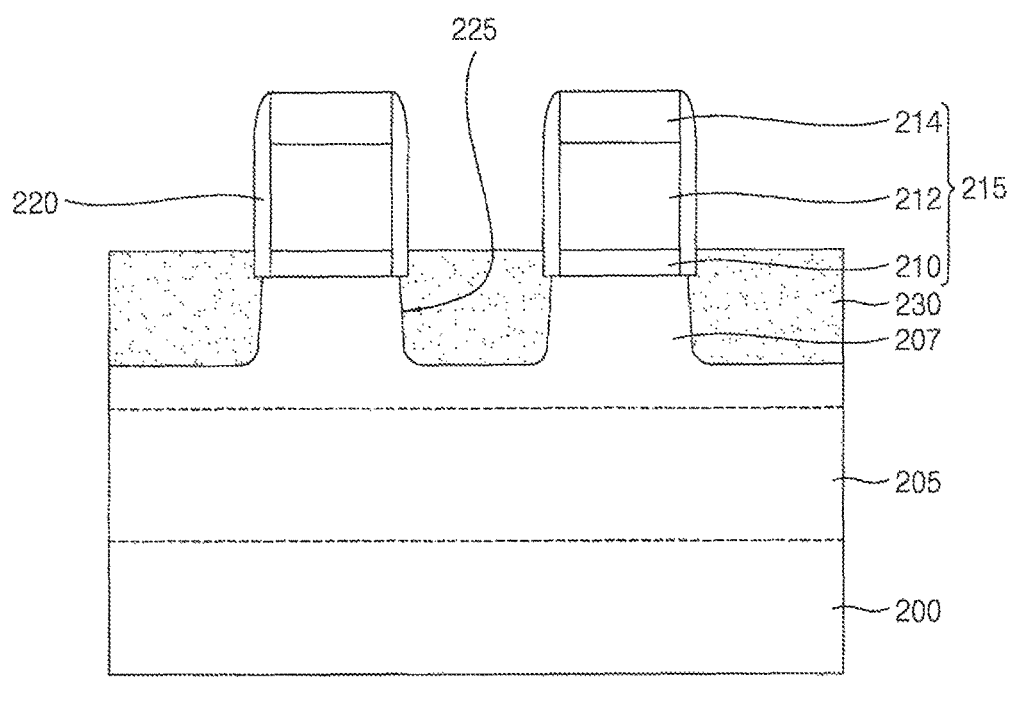

Referring to FIGS. 36 and 37, a source/drain layer 230 filling the recess 225 may be formed.

In example embodiments, the source/drain layer 230 may be formed by an SEG process using the top surface of the active fin 207 exposed by the recess 225 as a seed.

In some embodiments, an n-type impurity source such as phosphine (PH$_3$) or a p-type impurity source such as diborane (B$_2$H$_6$) may be provided together with a silicon source, such as silane in the SEG process.

The source/drain layer 230 may be grown vertically and laterally to have, e.g., a polygonal cross-section as illustrated in FIG. 36. In some embodiments, the source/drain layer 230 may sufficiently fill the recess 225 to contact a lower portion of the gate spacer 220.

Figure 38:
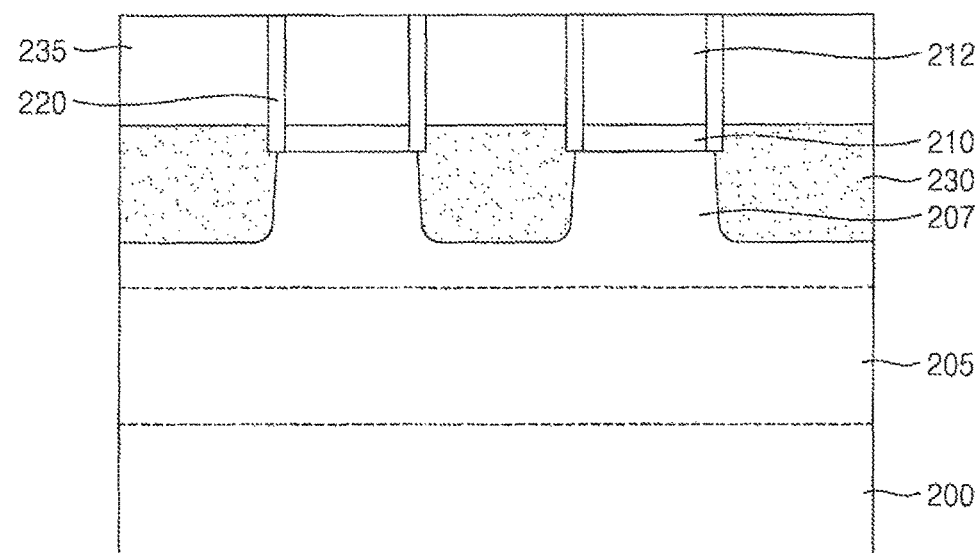

Referring to FIG. 38, a lower insulation layer 235 covering the dummy gate structure 215, the gate spacer 220 and the source/drain layers 230 may be formed on the active fin 207 and the isolation layer 202. An upper portion of the lower insulation layer 235 may be planarized by a CMP process and/or an etch-back process until a top surface of the gate electrode 212 may be exposed.

In some embodiments, the dummy gate mask 214 may be removed by the CMP process, and an upper portion of the gate spacer 220 may be also partially removed.

The lower insulation layer 235 may be formed of, e.g., a silicon oxide-based material by a CVD process. The lower insulation layer 235 may correspond to, e.g., the lower insulation layer 120 illustrated in FIGS. 1 to 15.

Figure 39:
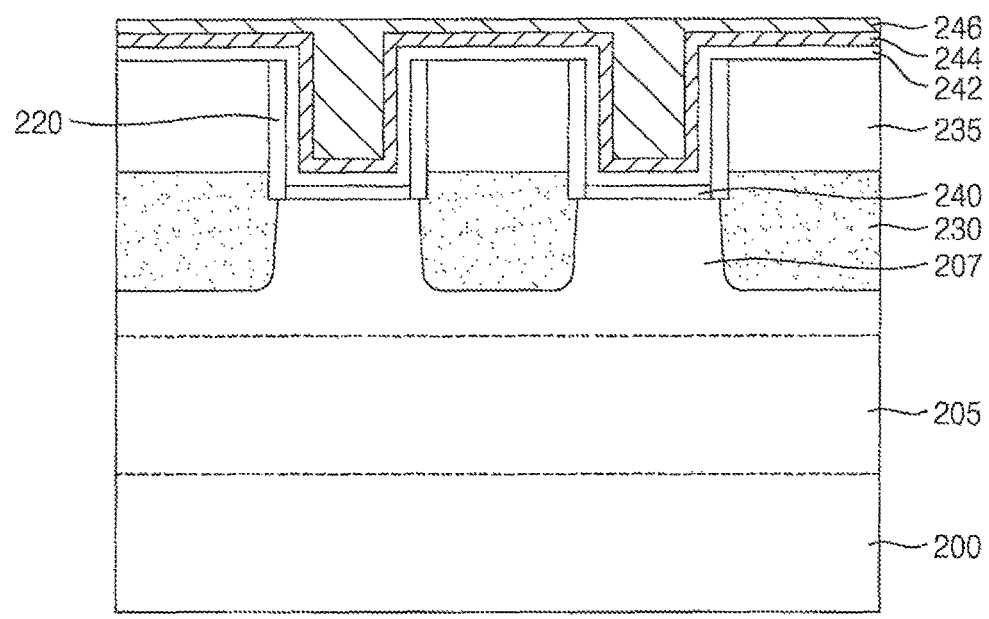

Referring to FIG. 39, the dummy gate electrode 212 and the dummy gate insulation pattern 210 may be removed. Accordingly, a trench (not illustrated) exposing an upper portion of the active fin 207 may be formed between a pair of the gate spacers 220.

The exposed active fin 207 may be thermally oxidized to form an interface layer 240. A gate insulation layer 242 may be formed along a top surface of the lower insulation layer 235, an inner wall of the trench, and top surfaces of the interface layer 240 and the isolation layer 202, and a buffer layer 244 may be formed on the gate insulation layer 242. A gate electrode layer 246 filling a remaining portion of the trench may be formed on the buffer layer 244.

The gate insulation layer 242 may be formed of a metal oxide having a high dielectric constant (high-k), such as hafnium oxide, tantalum oxide and/or zirconium oxide. The buffer layer 244 may be included for adjusting a work function of a gate electrode. The buffer layer 244 may be formed of a metal nitride, such as titanium nitride, tantalum nitride and/or aluminum nitride. The gate electrode layer 246 may be formed of a metal having a low electric constant, such as aluminum, copper, tungsten, or the like.

The gate insulation layer 242, the buffer layer 244 and the gate electrode layer 246 may be formed by a CVD process, an ALD process, a PVD process, etc. In some embodiments, the interface layer 240 may be also formed by a deposition process, such as a CVD process or an ALD process. In this case, the interface layer 240 may have a profile substantially the same as or similar to that of the gate insulation layer 242.

Figure 40:
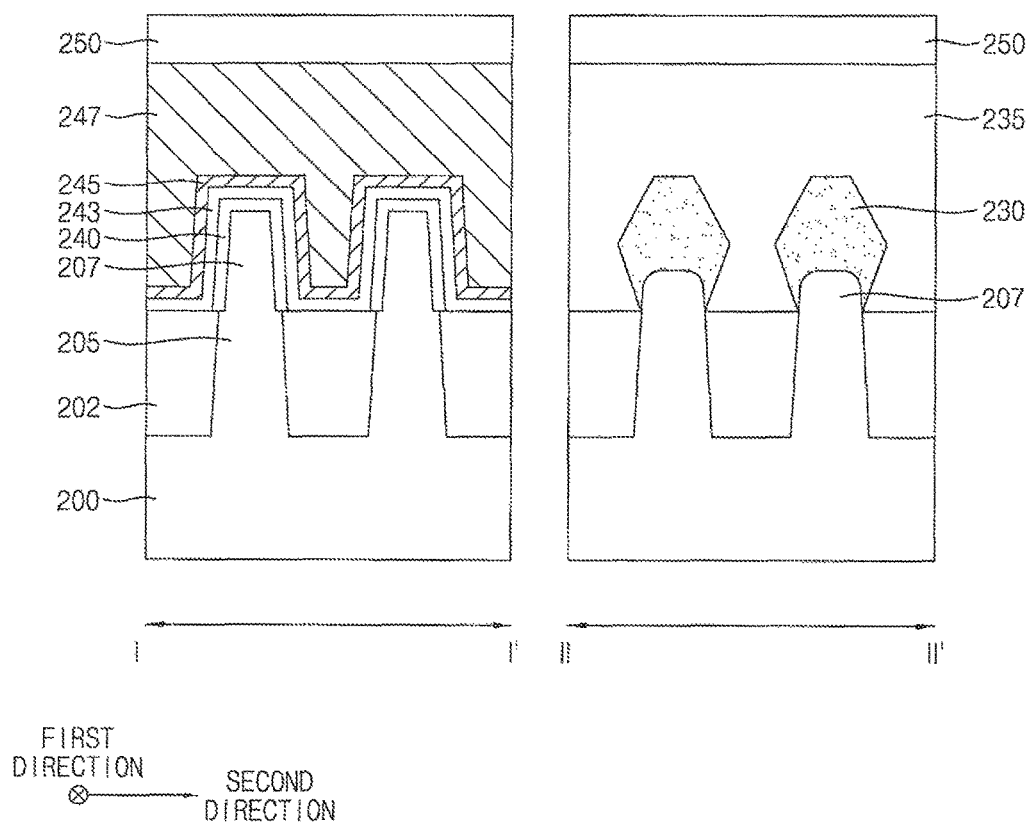

Referring to FIGS. 40 and 41, upper portions of the gate electrode layer 246, the buffer layer 244 and the gate insulation layer 242 may be planarized by, e.g., a CMP process, until the top surface of the lower insulation layer 235 may be exposed.

After the planarization process, a gate structure including the interface layer 240, a gate insulation pattern 243, a buffer pattern 245 and a gate electrode 247 may be defined in the trench. An NMOS transistor or a PMOS transistor having a FinFET structure may be defined by the gate structure and the source/drain layer 230. In example embodiments, the gate structure may correspond to the gate pattern 110 illustrated in FIGS. 1 to 25.

A passivation layer 250 may be formed on the lower insulation layer 235, the gate spacers 220 and the gate structure. The passivation layer 250 may be formed of a nitride-based material, such as silicon nitride or silicon oxynitride by a CVD process. A portion of the passivation layer 250 covering the gate structure may serve as a gate mask.

Figure 42:
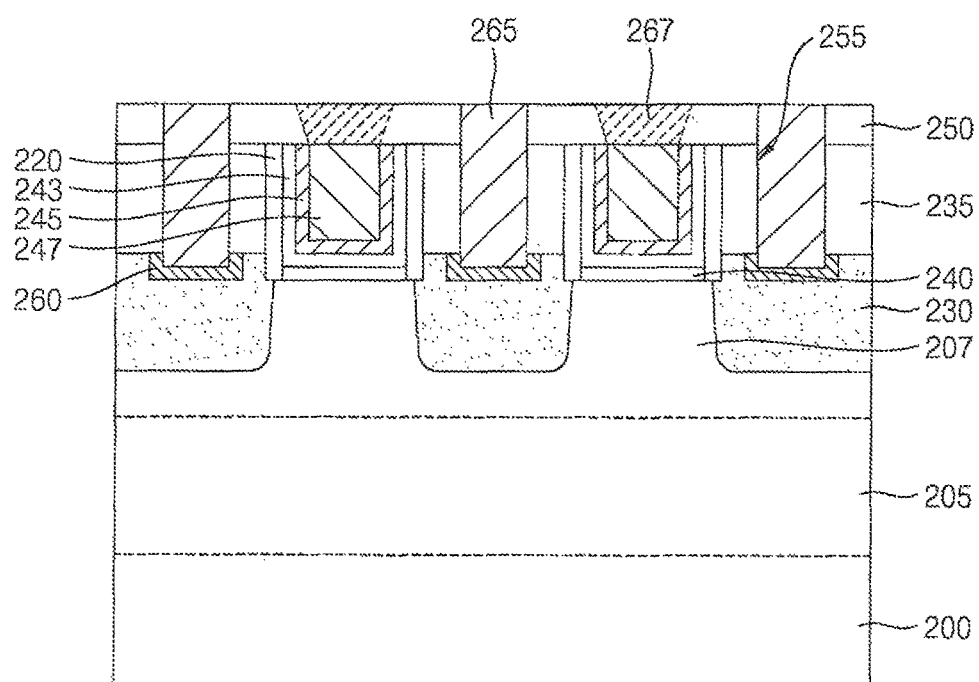

Referring to FIG. 42, an active contact 265 electrically connected to the source/drain layer 230 may be formed.

In example embodiments, the passivation layer 250 and the lower insulation layer 235 may be partially etched to form a contact hole 255 through which the source/drain layer 230 may be exposed.

In some embodiments, while performing the etching process for the formation of the contact hole 255, an upper portion of the source/drain layer 230 may be partially removed. Accordingly, the contact hole 255 may be partially inserted into the upper portion of the source/drain layer 230.

In example embodiments, a silicide pattern 260 may be formed at the upper portion of the source/drain layer 230 exposed through the contact hole 255. For example, a metal layer may be formed on the source/drain layer 230 exposed through the contact hole 255, and then a thermal treatment, such as an annealing process may be performed thereon. A portion of the metal layer contacting the source/drain layer 230 may be transformed into a metal silicide by the thermal treatment. An unreacted portion of the metal layer may be removed to form the silicide pattern 260. The silicide pattern 260 illustrated in FIG. 42 may correspond to, e.g., the silicide pattern 116 illustrated in FIGS. 24 and 25.

The metal layer may be formed of, e.g., cobalt or nickel. The silicide pattern 260 may include, e.g., cobalt silicide or nickel silicide.

In some embodiments, the silicide pattern 260 may protrude from a top surface of the source/drain layer 260 to fill a lower portion of the contact hole 255.

In some embodiments, the contact hole 255 may be self-aligned with the gate spacer 220. In this case, an outer sidewall of the gate spacer 220 may be exposed by the contact hole 255

Subsequently, the active contact 265 filling the contact hole 255 may be formed. For example, a conductive layer sufficiently filling the contact holes 255 may be formed on the passivation layer 250. An upper portion of the conductive layer may be planarized by a CMP process until a top surface of the passivation layer 250 may be exposed to form the active contacts 265. The conductive layer may be formed of a metal, a metal nitride, a metal silicide or a doped polysilicon. In some embodiments, a barrier layer including a metal nitride, such as titanium nitride may be further formed along an inner wall of the contact hole 255 before forming the conductive layer.

In some embodiments, a gate contact 267 may be formed on the gate structure. The gate contact 267 may be formed through the passivation layer 250 to be in contact with a top surface of the gate electrode 247.

In some embodiments, the gate contact 267 and the active contact 265 may be formed by substantially the same etching process and deposition process.

Subsequently, a back-end-of-line (BEOL) process for forming a routing circuit of the logic semiconductor device may be performed.

Referring to FIG. 43, a first insulating interlayer 300 covering the active contacts 265 and the gate contacts 267 may be formed on the passivation layer 250. A first contact 310 electrically connected to the active contact 265 may be formed in the first insulating interlayer 300.

A second insulating interlayer 320 covering the first contacts 310 may be formed on the first insulating interlayer 300. A lower wiring 330 electrically connected to the first contact 310 may be formed in the second insulating interlayer 320. For example, as also described with reference to FIGS. 1 to 15, the lower wiring 330 may extend in the first direction, and a plurality of the lower wirings 330 may be formed along the second direction. A horizontal routing may be achieved by the lower wirings 330.

The first and second insulating interlayers 300 and 320 may be formed of a low-k material, such as silicon oxide or siloxane-based materials by a CVD process or a spin coating process.

The first contact 310 and the lower wiring 330 may be formed of a metal, e.g., copper, tungsten, etc.

In some embodiments, the lower wirings 330 may be formed by a self-aligned double patterning (SADP) process. For example, sacrificial patterns may be formed on the first insulating interlayer 300, and spacers may be formed on sidewalls of the sacrificial patterns. Subsequently, the sacrificial patterns may be removed. A metal layer may be formed in spaces from which the sacrificial patterns are removed and in spaces between the spacers to form the lower wirings 330.

In some embodiments, the lower wirings 330 may be formed by a dual damascene process together with the first contact 310. For example, the second and first insulating interlayers 320 and 300 may be partially removed to form a via hole exposing the active contact 265, and a trench extending from an upper portion of the via hole. The via hole and the trench may be filled with a metal by, e.g., a copper plating process to form the first contact 310 and the lower wiring 330.

In some example embodiments, as described with reference to FIGS. 9 to 15, insulation blocks may be formed on the first insulating interlayer 300 before forming the lower wirings 330. In this case, the lower wirings 330 may be divided into a plurality of fragments by the insulation blocks.

Figure 44:
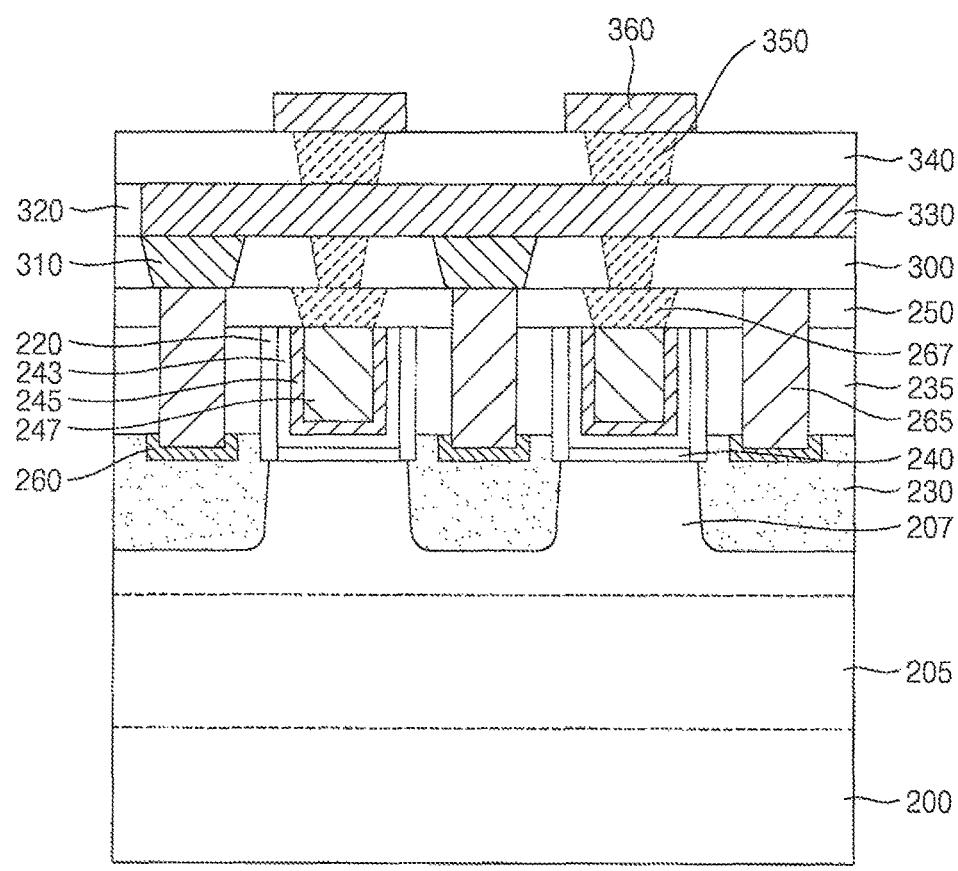

Referring to FIG. 44, a third insulating interlayer 340 covering the lower wirings 330 may be formed on the second insulating interlayer 320. The third insulating interlayer 340 may be formed using a material and/or a process substantially the same as those for the first and second insulating interlayers 300 and 320.

In some example embodiments, as also described with reference to FIGS. 4 to 8, a through contact 350 extending through the third to first insulating interlayers 340, 320 and 300 may be formed to be electrically connected to the gate contact 267.

For example, the third to first insulating interlayers 340, 320 and 300 may be partially etched to form a through hole at least partially exposing a top surface of the gate contact 267. A metal layer may be formed in the through hole by, e.g., a metal deposition process or a metal plating process to form the through contact 350.

Upper wirings 360 may be formed on the third insulating interlayer 340. As illustrated in FIG. 44, the upper wiring 360 may be electrically connected to the gate contact 267 via the through contact 350. As also described with reference to FIGS. 1 to 15, the upper wiring 360 may extend in the second direction, and a plurality of the upper wirings 360 may be formed along the first direction. A vertical routing of the logic semiconductor device may be achieved by the upper wirings 360.

In some example embodiments, a second contact connecting the upper wiring 360 and the lower wiring 330 may be further formed in the third insulating interlayer 340.

In some embodiments, the upper wirings 360 may be formed by an SADP process as mentioned above. In some embodiments, the upper wirings 360 may be formed by a dual damascene process together with the through contact 350.

Figure 45:
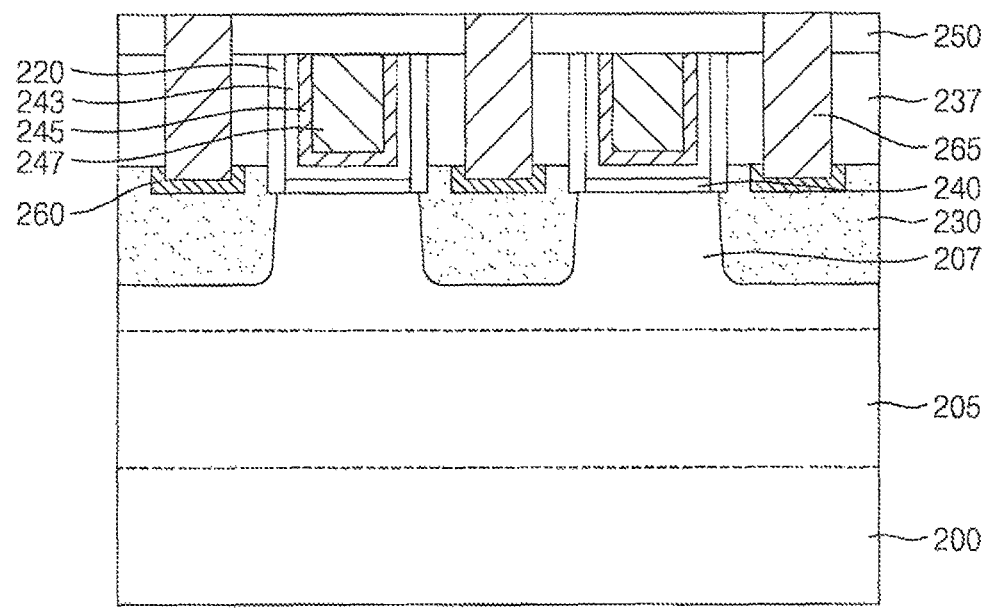
Figure 47:
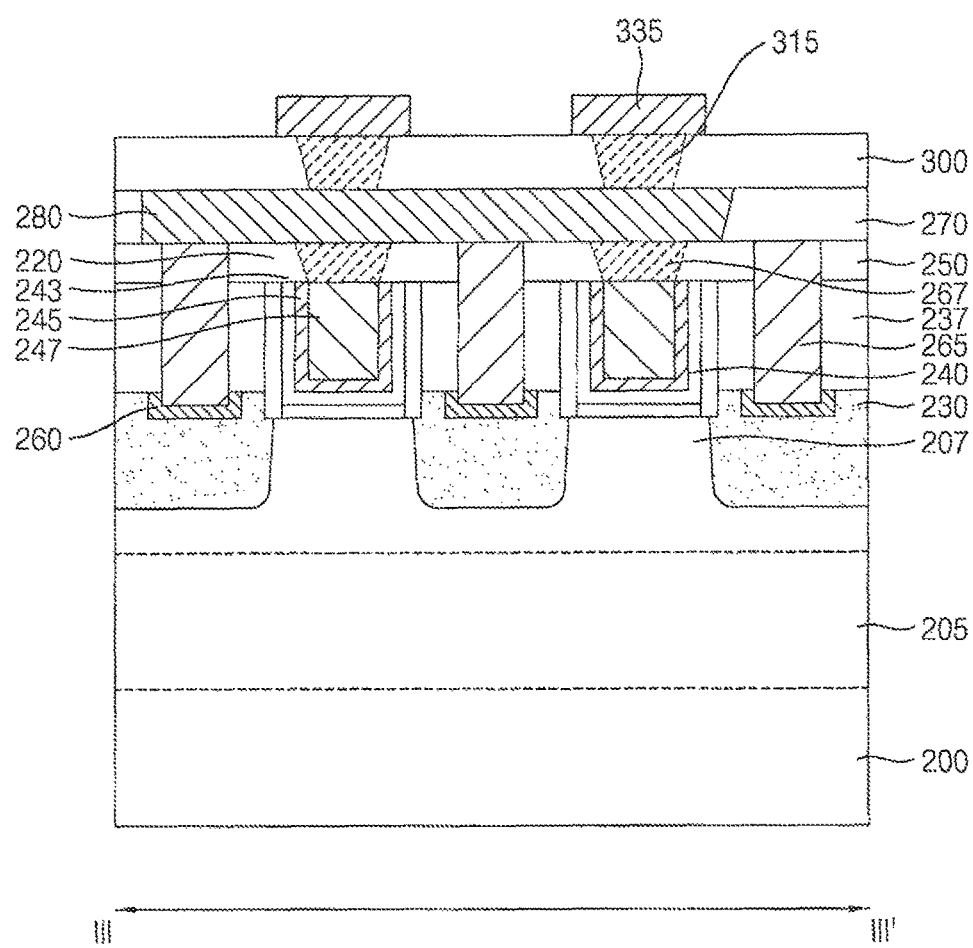

FIGS. 45, 46 and 47 are cross-sectional views illustrating a method of manufacturing a semiconductor device in accordance with example embodiments of the inventive concept.

Detailed descriptions of processes substantially the same as or similar to those illustrated with reference to FIGS. 26 to 44 are omitted herein.

Referring to FIG. 45, processes substantially the same as or similar to those illustrated with reference to FIGS. 26 to 42 may be performed.

Accordingly, active patterns 205 (including active fins 207) extending in the first direction may be formed on the substrate 200, and gate structures extending in the second direction may be formed on the active patterns 205. The gate structure may include an interface layer 240, a gate insulation pattern 243, a buffer pattern 245 and a gate electrode 247 formed between a pair of gate spacers 220.

A source/drain layer 230 and a silicide pattern 260 may be formed at an upper portion of the active fin 207 adjacent to the gate structure. An active contact 265 may be formed through a passivation layer 250 and a first lower insulation layer 237 to be in contact with the silicide pattern 260.

Referring to FIG. 46, a second lower insulation layer 270 covering the active contact 265 and the gate contact 267 may be formed on the passivation layer 250. The second lower insulation layer 270 and the first lower insulation layer 237 may be formed of substantially the same silicon oxide.

A sub-wiring 280 electrically connected to the active contact 265 may be formed in the second lower insulation layer 270. For example, as also described with reference to FIGS. 16 to 25, the sub wiring 280 may be electrically connected to a plurality of the active contacts 265, and may extend in the first direction. A plurality of the sub-wirings 280 may be formed along the second direction. A horizontal routing of the logic semiconductor device may be achieved by the sub-wirings 280.

In some example embodiments, the sub-wiring 280 may be formed by, e.g., a triple damascene process together with the active contact 265 and agate contact 267.

For example, the second lower insulation layer 270, the passivation layer 250 and the first lower insulation layer 237 may be etched to form a via hole exposing the source/drain layer 230 or the silicide pattern 260, and a trench being integrally connected with an upper portion of the via hole and extending in the first direction. A contact hole exposing a top surface of the gate electrode 247 and extending through the second lower insulation layer 270 and the passivation layer 250 may be also formed by the etching process.

A metal layer concurrently filling the via hole, the trench and the contact hole may be formed by a metal plating process and/or a metal deposition process, and an upper portion of the metal layer may, be planarized until a top surface of the second lower insulation layer 270 may be exposed. Accordingly, the active contact 265 and the sub-wiring 280 may be formed in the via hole and the trench, respectively, and the gate contact 267 filling the contact hole may be also formed. The active contact 265 and the sub wiring 280 may be formed as a substantially unitary or monolithic member.

Referring to FIG. 47, a first insulating interlayer 300 covering the sub-wirings 280 may be formed on the second lower insulation layer 270. A first contact 315 may be formed through the first insulating interlayer 300 to be in contact with a top surface of the gate contact 267.

A lower wiring 335 electrically connected to the first contact 315 may be formed on the first insulating interlayer 300.

As also described with reference to FIGS. 16 to 35, the lower wiring 335 may extend in the second direction, and a plurality of the lower wirings 335 may be formed along the first direction. Accordingly, a vertical routing of the logic semiconductor device may be achieved by the lower wirings 335.

In some embodiments, the lower wiring 335 may be electrically connected to the sub-wiring 280 via the first contact 315.

According to example embodiments of the present inventive concepts, wirings formed by, e.g., a back-end-of-line (BEOL) process may be disposed at a plurality of levels, and the wiring at each level may be designed to extend only in one direction. Thus, a resolution limit of a patterning process and a process complexity caused when forming wirings at a single level to extend in different directions may be resolved. A lower wiring and an upper wiring may cross each other, and may be connected to each other such that a bidirectional wiring construction may be achieved.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents hut also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A logic semiconductor device, comprising:
   a plurality of active patterns extending in a first direction and being spaced apart from each other in a second direction, the first and second directions being perpendicular to each other;
   an isolation layer defining the active patterns;
   a plurality of gate patterns extending in the second direction on the active patterns and the isolation layer, the gate patterns being spaced apart from each other in the first direction and at least one of the gate patterns being on the plurality of active patterns;
   active contacts connected to upper portions of the active patterns adjacent to the gate patterns;
   a plurality of sub-wirings integrally connected to the active contacts, the sub-wirings extending in the first direction; and
   wirings extending in the second direction over the sub-wirings.

2. The logic semiconductor device of claim 1, further comprising gate contacts disposed on the gate patterns.

3. The logic semiconductor device of claim 2, wherein top surfaces of the sub-wirings and the gate contacts are coplanar with each other relative to the active patterns.

4. The logic semiconductor device of claim 2, wherein the wirings are disposed at a single level, and each of the wirings overlaps each of the gate patterns.

5. The logic semiconductor device of claim 4, further comprising first contacts connecting the gate contacts and the wirings.

6. The logic semiconductor device of claim 1, further comprising silicide patterns formed at the upper portions of the active patterns adjacent to the gate patterns,
   wherein the active contacts are in contact with the silicide patterns.

7. A logic semiconductor device, comprising:
   a plurality of active patterns extending in a first direction and being spaced apart from each other in a second direction, the first and second direction being perpendicular to each other;
   an isolation layer defining the active patterns;
   a plurality of gate patterns extending in the second direction on the active patterns and the isolation layer, the gate patterns being spaced apart from each other in the first direction and at least one of the gate patterns being on the plurality of active patterns;
   a plurality of lower wirings extending in the first direction over the gate patterns and being spaced apart from each other in the second direction, the lower wirings having a straight line shape; and
   a plurality of upper wirings extending in the second direction over the lower wirings and being spaced apart from each other in the first direction, the upper wirings having a straight line shape.

8. The logic semiconductor device of claim 7, wherein the lower wirings and the upper wirings do not include a protrusion or a diverging portion.

9. The logic semiconductor device of claim 7, further comprising:
first contacts connecting the gate patterns or active patterns to the lower wirings; and
second contacts connecting the upper wirings and the lower wirings.

10. The logic semiconductor device of claim 7, wherein the upper wirings serve as input/output pins, and the lower wirings serve as a gate pick-up wiring and a power rail.

11. A logic semiconductor device, comprising:
an active pattern;
a gate pattern on the active pattern and extending in a first direction to cross over the active pattern;
an upper wiring aligned with the gate pattern and extending in the first direction; and
a lower wiring between the gate pattern and the upper wiring and being aligned with the active pattern so as to extend in a second direction, the upper wiring crossing over the lower wiring.

12. The logic semiconductor device of claim 11, further comprising:
an interlayer insulating layer between the upper wiring and the lower wiring; and
a contact extending through the interlayer insulating layer so as to connect the lower wiring to the upper wiring.

13. The logic semiconductor device of claim 11, wherein the lower wiring is one of a plurality of lower wirings; and
wherein the plurality of lower wirings comprises a power rail, the power rail having a width in the first direction that is greater than widths of other ones of the plurality of lower wirings.

14. The logic semiconductor device of claim 11, further comprising:
an insulation block that is configured to divide the lower wiring into a first lower wiring portion and a second lower wiring portion.

15. The logic semiconductor device of claim 14, wherein the active pattern is a first active pattern and the gate pattern is a first gate pattern, further comprising:
a second active pattern;
a second gate pattern on the second active pattern;
a first gate contact on the first gate pattern;
a second gate contact on the second gate pattern;
a first contact that connects the first lower wiring portion to the first gate contact; and
a second contact that connects the second lower wiring portion to the second gate contact.

16. The logic semiconductor device of claim 11, further comprising:
a gate contact on the gate pattern;
a plurality of interlayer insulating layers between the upper wiring and the gate contact; and
a through contact extending through the plurality of interlayer insulating layers so as to connect the upper wiring to the gate contact.

17. The logic semiconductor device of claim 11, wherein the lower wiring is one of a plurality of lower wirings, further comprising:
a plurality of insulation blocks, each of the plurality of lower wirings being divided by at least one of the plurality of insulation blocks into multiple portions.

18. The logic semiconductor device of claim 17, wherein the plurality of insulation blocks is arranged in a staggered configuration along the second direction when the logic semiconductor device is viewed from a plan view.

* * * * *